United States Patent [19]

Cahen et al.

[11] Patent Number: 5,650,337
[45] Date of Patent: *Jul. 22, 1997

[54] MONOLITHIC OPTOELECTRONIC AND ELECTRONIC STRUCTURES

[75] Inventors: David Cahen, Rehovot; Leonid Chernyak, Ashdod, both of Israel; Abram Jakubowicz, Rueschlikon, Switzerland

[73] Assignee: Yeda Research and Development Co. Ltd., Rehovot, Israel

[*] Notice: The term of this patent shall not extend beyond the expiration date of Pat. No. 5,413,942.

[21] Appl. No.: 435,371

[22] Filed: May 5, 1995

Related U.S. Application Data

[63] Continuation-in-part of Ser. No. 899,548, Jun. 16, 1992, Pat. No. 5,413,942, which is a continuation-in-part of Ser. No. 489,816, Mar. 9, 1990, abandoned.

[30] Foreign Application Priority Data

Mar. 14, 1989 [IL] Israel ............................... 089617

[51] Int. Cl.⁶ ................................................ H01L 21/26
[52] U.S. Cl. ............................ 437/16; 437/14; 437/15; 437/170; 437/957
[58] Field of Search ................................. 257/430, 607; 437/14, 15, 16, 170, 957

[56] References Cited

U.S. PATENT DOCUMENTS 5,413,942  5/1995  Cahen et al. ........................... 437/16

*Primary Examiner*—Mahshid D. Saadat
*Assistant Examiner*—S. V. Clark
*Attorney, Agent, or Firm*—Keck, Mahin & Cate

[57] ABSTRACT

The invention related to a process for the production of a monolithic electronic and/or optoelectronic single-element or multi-element structure from a semionic material selected from the group of semionic materials comprising doped elemental semiconductors and doped binary, ternary or multinary chalcogenide or pnictide semiconductors, said process comprising: (a) establishing a location in a semionic body; (b) applying an electric field to said location in said semionic body; (c) maintaining said semionic body including said location at a temperature sufficiently low to preclude melting or decomposition of the semionic body while said electric field is being applied; and (d) controlling the electric field as to magnitude and time so that no decomposition and macroscopic melting of the material occurs while creating doping profiles sufficiently sharp to define at least one homojunction and thus create an electronic or optoelectronic device element in the semionic material in said location thereof. The invention further relates to the monolithic electronic and/or optoelectric structures produced by said process.

9 Claims, 21 Drawing Sheets

FIG. 2C1
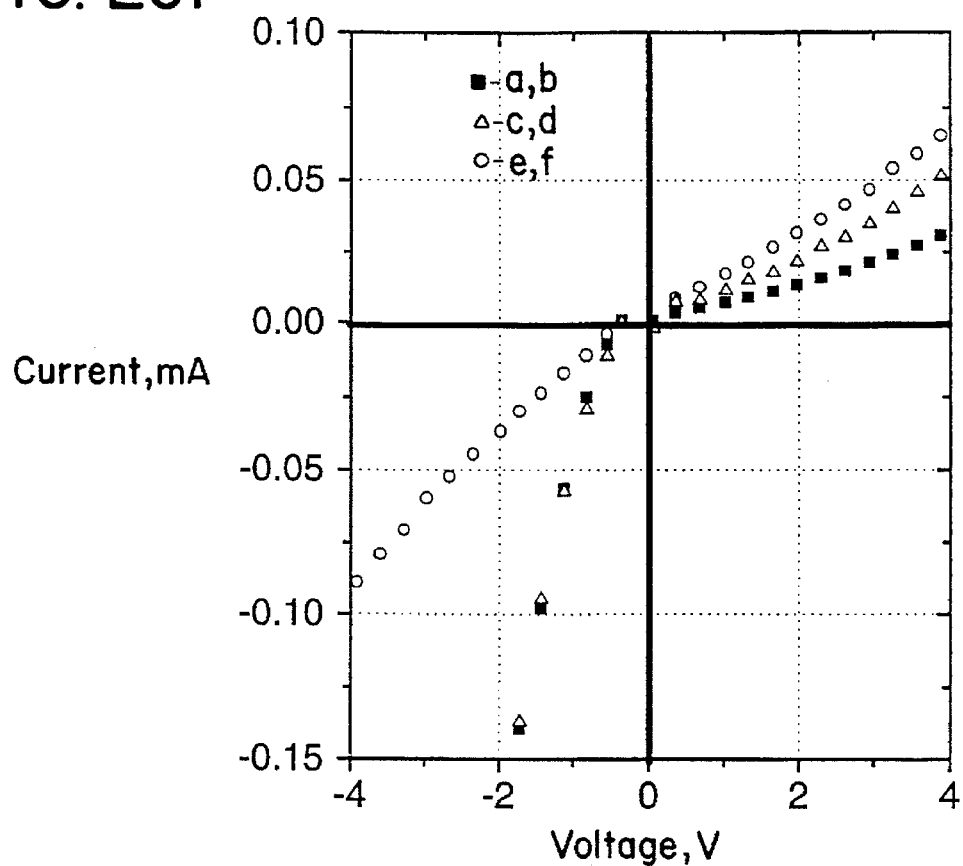
FIG. 2C2
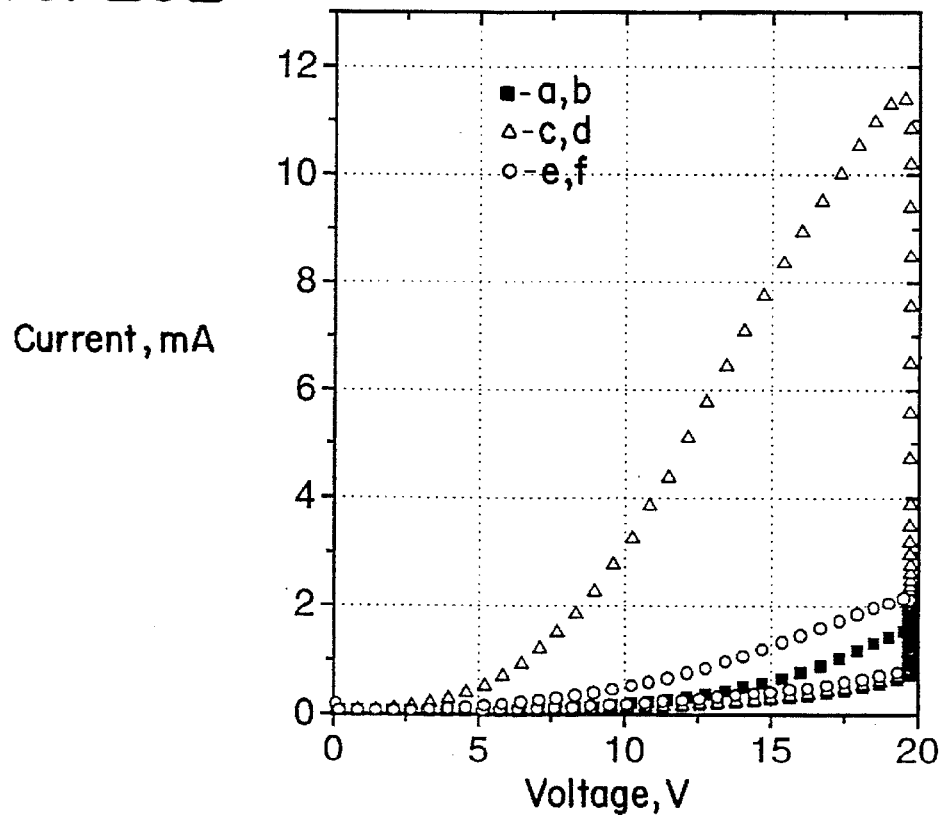

FIG. 2E3
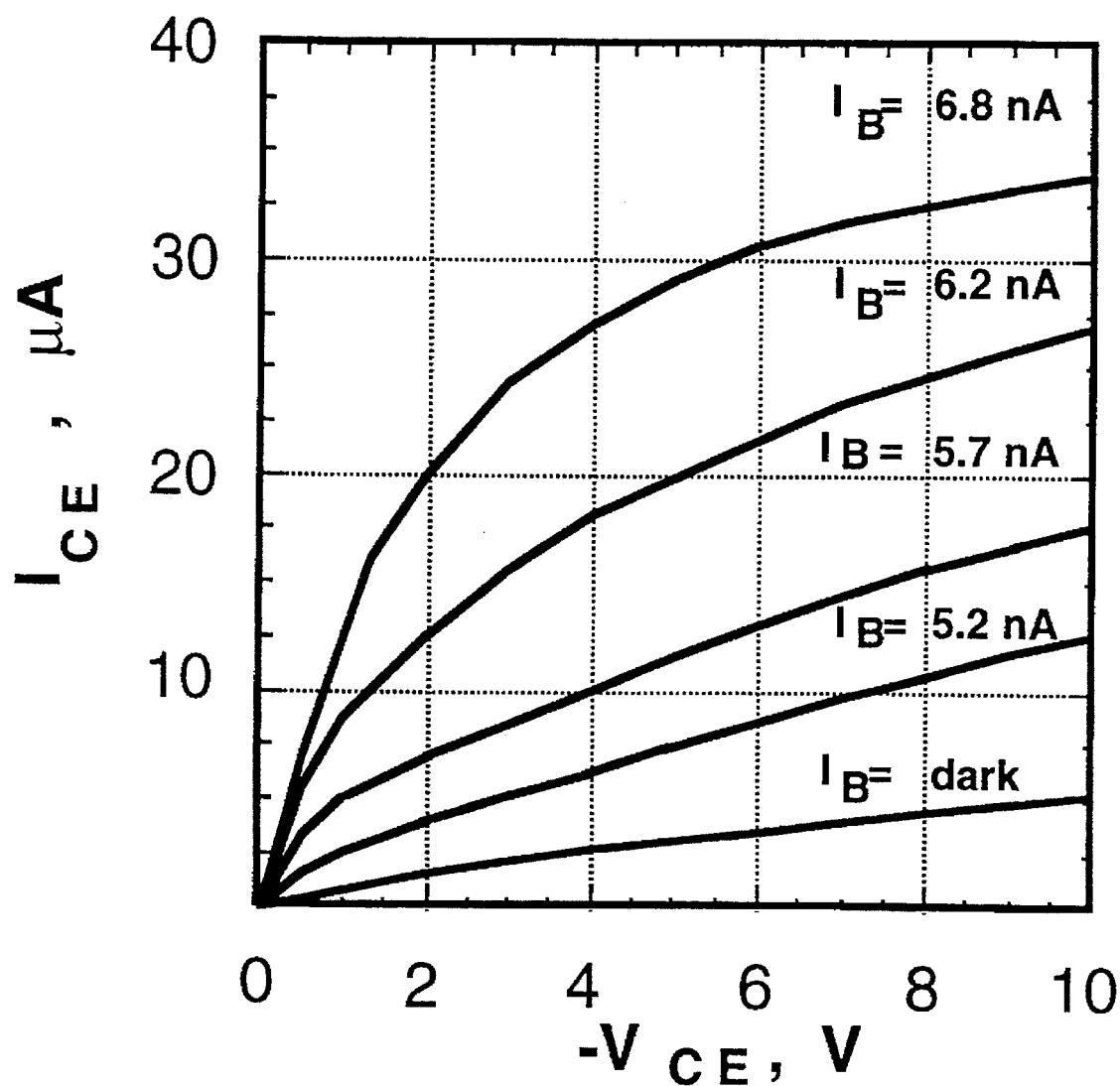

FIG. 2F1
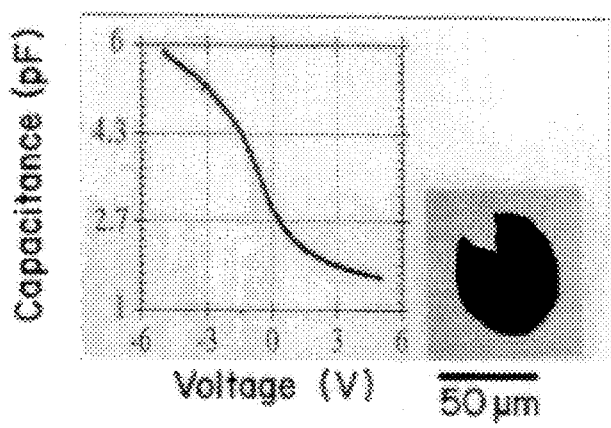
FIG. 2F2
FIG. 2F3
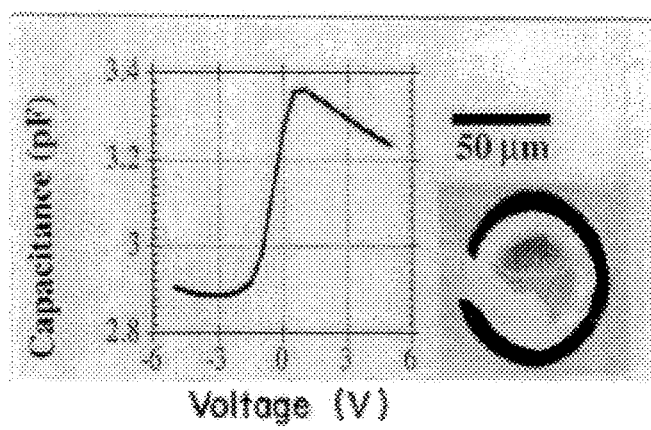
FIG. 2F4
FIG. 2F5
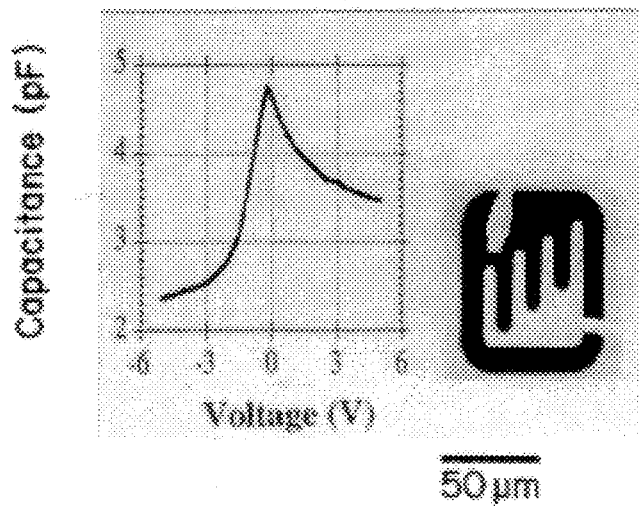
FIG. 2F6
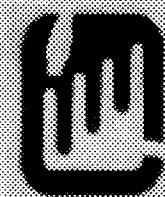

10 μm

10 μm 0.1 mm 0.1 mm

MONOLITHIC OPTOELECTRONIC AND ELECTRONIC STRUCTURES

This application is a continuation-in-part of application Ser. No. 07/899,548 filed Jun. 16, 1992, now U.S. Pat. No. 5,413,942, which is a continuation-in-part of Ser. No. 07/489,816 filed Mar. 9, 1990, now abandoned, entitled Monolithic Electronic Structure.

FIELD OF THE INVENTION

The invention relates to methods and structures that utilize an electric field, preferably in combination with a thermal and/or electromagnetic field, to create semiconductor devices in a semionic material, without the need for an external dopant source, at room temperature or below, and to devices and articles created thereby.

According to the invention, current flow, as a result of the application of the electric field, is limited in magnitude and time, so as to prevent macroscopic melting of either the semionic material or of the material(s) used to make electrical contact to it. In addition, the electric field is chosen so as not to lead to macroscopic decomposition of the semionic material.

According to the invention, an electric field, with or without a thermal profile, induces/creates single or multiple device elements in a semionic material. This material can be originally homogeneous and uniform with or without the presence of extraneous constituents. The process allows fabrication of a monolithic structure containing a plurality of different or identical types of electric device elements distributed in two or three dimensions in the semionic material.

The invention relates to a novel process for the production of semiconductor or semiconductor-containing devices for electronic and optical applications, without the need for thermal in-diffusion of external dopants and without the need for an external dopant source, even with a semiconductor material which may be homogeneous initially. More specifically, the invention relates to the use of an electric field to control the distribution of dopants in a semiconducting material, whose electronic properties are controlled by said dopants, at least one of which has sufficiently high mobility, so as to allow its direction of motion to be controlled by said field in a temperature region where said material's electrical behavior is extrinsic. Alternatively, one or more of the dopants can be created or annihilated by such field in such temperature region. This is feasible due to what is believed to be electromigration, driven by a direct, electrostatic force and/or by way of drag(wind) forces, e.g. electron wind.

BACKGROUND OF THE INVENTION

Basic building blocks of semiconductor devices are the junction, essentially a narrow region where the doping level and nature of dopants changes abruptly, and a conductor, used to lead electronic carriers to and from the junction or more complicated elements, comprising one or more junctions. Commonly junctions are fabricated by high temperature thermal diffusion of a dopant from an external source or by direct ion implantation of the dopant. This is so because of the need to reach conditions under which the dopants can move in the semiconductor, so that they can attain the necessary non-equilibrium distribution. At the temperature, where thermal diffusion is commonly carried out, a semiconductor with a doping density that is within the range, normally employed for electronic devices, behaves intrinsically. This means that it has a higher concentration of so called "intrinsic" free charge carriers (these are carriers that are generated by band-to-band transitions) than of carriers generated by dopants. This reduces the possibility to use electrical influence to guide the dopants, due to electrical screening. At lower temperatures, where such use could be beneficial, the dopants have too low diffusity. Ion implantation leads generally to damage in the region that has been implanted, leading to undesirable electrical properties that are removed by subsequent thermal anneal.

Both above methods need an external source, and a surface through which the doping species are introduced into the material, which limits the dimensionality of devices that can be produced in this manner (cf. Handbook on Semiconductors, T. S. Moss ed., vol. 3 "Materials, Properties and Preparation", S. P. Keller, volume ed. (North-Holland, Amsterdam, 1980)).

The effects of electric fields on influencing the motion of external dopants in simple, elemental semiconductors have been described for the cases of Li, Cu, Ag or Au in Ge or Si at elevated temperatures (C. S. Fuller and J. C. Severiens, Phys. Rev. 92 (1953) 1322; 94 (1954) 21; C. J. Gallagher, J. Phys. Chem. Solids 3 (1957) 82; see also B. I. Boltaks, "Diffusion in Semiconductors", Acad. Press N.Y. 1963). Fuller and Severiens studied Li migration in p-Si and p-Ge at ~350°–900° C., ~10 V/cm by the p/n junction method, after local thermal in-diffusion of Li (C. S. Fuller, J. C. Severiens, Phys. Rev., 96 (1954), 21). Commercial radiation detectors (T. Miyachi, S. Ohkawa, T. Emura, M. Nishimura, O. Nitoh, K. Takahashi, S. Kitamura, Y. Kim, T. Abe and H. Matsuzawa, Jap. J. Appl. Phys., 27 (1988), 307) resulted from the finding that high resistivity Si was obtained after electromigration of Li into p-Si. Here interstitial Li ($Li_i$) acts as donor, compensating acceptors. Li profiles in Si were formed at 50°–350° C. by E. M. Pell, J. Appl. Phys., 31 (1960), 291). Pell has shown that under the condition, when a sample (Si, with an n/p junction, created by Li doping) is kept at elevated temperature and an electric field is applied, Li drift leads to the creation of an intrinsic area in the bulk of the Si. Therefore, the initial n/p junction transforms into an n/i/p junction.

Interstitial Cu is also found to be mobile at elevated temperatures in Si, Ge, and GaAs. Cu drift at 250° C. and electric field strength of 2 V/cm was investigated by the radioactive tracer technique in GaAs (R. N. Hall, J. H. Racette, J. Appl. Phys., 35 (1964), 379). Acceptor behavior of substitutional Cu was used for the compensation of shallow donors in GaAs (R. A. Roush, D. C. Stoudt, M. S. Mazzola, Appl. Phys. Lett., 62 (1993), 2670). For modern electronic devices Cu, Li, and the like are undesirable as dopants in Si, for example, as they lead to deterioration of the required electronic properties. An exception is their use in photoconductive devices, which often have a homogeneous distribution of the dopant, and as lifetime killers in transistors to improve switching times. Klingler et al. (Klinger et al. Appl. Phys., A59 (1994) 233) have shown the feasibility of p-n junction creation in $TiO_2$. In the case of $TiO_2$ (described also in J. Solid State Chem. 21 (1977) 305 and Solid State Ionics 18/19 (1986) 873) the freezing-in of a smooth linear doping profile, created at high temperature (700° C.) by applying an electric or chemical potential gradient is suggested to create p and n regions.

Freezing-in had to be used here as in classical doping by thermal in-diffusion, since otherwise the compositional gradients that are created will not be stable. Indeed stability is one of the more problematic aspects of using an electric field for doping. This problem can be overcome by the present invention by using high field strengths, since then new, non-equilibrium mechanisms, that change the dopant density, can be activated. The situation can be compared to that of thermal in-diffusion of dopants, where a non-equilibrium state, obtained at high temperature, is frozen in, giving a doping profile that is stable under temperatures where the device works. In contradistinction, the present invention creates a non-equilibrium profile with a strong electric field which is stable at the lower fields used during operation of the device.

Semionics, the types of materials that the invention relates to, have been studied, in terms of their basic properties. One of them, $CuInSe_2$, is being developed in thin film polycrystalline form, for use in a photovoltaic device. The occurrence of ionic conductivity in a number of semionics, was disclosed in U.S. Pat. No. 4,115,633. The materials were of the type $ABX_2$ and $AB_5X_8$ where A=Cu,Ag; B=In,Ga; X=S,Se. In later work, it was shown that a high electric field, applied to an $In/CuInTe_2/In$ structure, can cause a change from a low to a high conductivity state. Because of the very high current that flows, thermal effects probably played a dominant role (I. V. Bodnar et al., Neorg. Mater. 20, (1984) 1810). R. J. Matson et al. (Appl. Phys. Lett. 50, (1987) 158) showed that CdS deposition onto $CuInSe_2$ can lead to partial conversion of the $CuInSe_2$, from p to n-type. In previous studies of semionics (D. Soltz, M. Sc. Thesis, Feinberg Graduate School, The Weizmann Institute of Science, Israel (1987); D. Soltz et al., Solid State Ionics, 28–30 (1988) 1105) normal classical thermal diffusion (e.g. of Cu) was found to lead to type conversion in $CuInSe_2$.

In these studies the effective diffusion coefficient of Cu was measured in $CuInSe_2$, in separate experiments, using a well-known point contact method, without using an external phase. However, attempts to obtain type conversion by this method were not successful, since they led to thermal breakdown of part of the material, due to run-away current flow. The only electric field effects noted in these studies were those obtained close to equilibrium, leading to the smeared-out gradual compositional gradients created during measurement of the diffusion coefficient.

Another type of semionic is (Hg,Cd)Te, a material that is also of interest for its infra-red detection properties. In addition, there are various other semiconducting materials, such as, Cu or Li doped ones, e.g. Si:Li, Ge:Li, CdS:Cu; ZnSe:Li and GaAs:Cu(:Si), that are mostly of interest for optical or opto-electronic applications (photoconductivity, optical switching, light emission, x-ray and x-ray detection) that show semionic behavior. Some analogues of $CuInSe_2$ (e.g. $AgGaSe_2$, $ZnGeP_2$) are furthermore of interest for non-linear optical applications.

SUMMARY OF THE INVENTION

It is a general object of the present invention to provide a novel process and apparatus, generally applicable to semionic materials, to circumvent the problem of resorting to an external source as dopant to create suitable novel electronic device structures. It is a further object of the invention to provide a process for this purpose that can be used at room temperature and even below. It is a further object of the invention to create such structures in an externally controllable fashion by applying an electric field alone or in conjunction with an additional excitation field, such as a thermal or electromagnetic one.

The invention relates to monolithic electronic and opto-electronic structures, made from semionic materials, said materials satisfying the following criteria:

— They are semiconductors which contain at least one dopant, native or foreign, that has sufficient diffusivity, so that it can be rendered mobile at temperatures, well removed from those where the material becomes intrinsic ($E_G/kT>15$; $E_G$: optical band gap of the material), under the influence of an electric field that is insufficient to lead to melting or decomposition of the material.

— While, normally, application of high electric fields to a conductive material, leads to run-away heating, thus facilitating thermal diffusion processes or even decomposition, one preferred embodiment of the invention relates to the use of AC or pulsed fields to overcome this problem. In other preferred embodiments the material is either actively or passively cooled, or both, during the application of the electric field or of the electric and electromagnetic or particle beam-induced field.

— The material retains its semiconducting character, also when small (up to about 5 atom percent) deviations from the ideal stoichiometry occur or are induced. This may occur also over limited spatial regions.

— The material provides the necessary dopants, without the need of adding external material for this.

— The material can provide the necessary dopants itself, by the ionization of native defects already present, or by creation of native defects, such as vacancies, interstitials and/or anti-site defects.

— At low electric fields and temperatures, to which devices are normally exposed, the dopant distribution that has been created at high electric field strength, used during its creation, is stable.

— At low electric fields and temperatures, to which devices are normally exposed, the components that are mobile at high fields, do not move.

— The net ionized donor or acceptor (i.e. ionized dopant) density in the material is above the carrier density provided by intrinsically created carriers, but below the density that would constitute degenerate electrical behavior. The preferred range of the net ionized donor or acceptor density is from a factor of 10 to about $10^5$ above the density provided by intrinsically created carriers to a factor of 10 below the density needed for degenerate behavior.

The semionic materials used in the present invention are doped elemental semionic semiconductors and doped binary, ternary or multinary chalcogenide or pnictide semionic semiconductors in which the dopant may be native or foreign.

In one embodiment, the semionic material is a doped elemental semiconductor, such as of formula IV:I (throughout the specification and claims herein the Roman numerals refer to columns in the Periodic Table of the Elements), wherein IV represents Si or Ge and the dopant column I element is, for example, Li, Na, Cu or Ag. In one preferred embodiment, the semionic material is Si:Li.

In another embodiment, the semionic material is a doped binary chalcogenide semiconductor comprising foreign dopants. Said binary chalcogenide has, for example, the formula II-VI and may be doped, for example, with a I element, i.e. II-VI:I. Examples of group II elements are Cd and Zn; of group VI elements are S, Se and Te, and of doping group I elements are Li, Na, Cu and Ag. In a preferred embodiment, the doped binary chalcogenide is CdS:Cu.

In a further embodiment of the invention, the semionic material is a doped binary pnictide semiconductor comprising a foreign dopant. Said binary pnictide has, for example, the formula III-V, and may be doped with a column I or II element, i.e. III-V:I and III-V:II, respectively. Examples of group III elements are Ca, In and Al, of group V elements are P, As and Sb, of doping group I elements are Li, Na, Cu and Ag, and of doping group II elements are Cd, Zn and Hg. In a preferred embodiment, the doped binary pnictide is InP:Zn or GaAs:Cu.

In a further embodiment, the semionic material used in the invention is a semionic binary alloy chalcogenide semiconductor including native dopants such as of the formula (IIa,IIb)-VI, wherein IIa and IIb are two elements selected from the group comprising the elements Cd, Zn and Hg, and the group VI element is S, Se or Te. In a preferred embodiment, this semionic material is (Hg,Cd)Te or (Hg,Zn)Te.

In a still further embodiment, the semionic material used in the invention is a doped ternary chalcogenide semiconductor comprising native dopants, selected from the group of ternary materials of the formulae $I\text{-}III\text{-}VI_2$, $I\text{-}V\text{-}VI_2$, $I\text{-}III_5\text{-}VI_8$, $I\text{-}III_3\text{-}VI_5$, $I_3\text{-}V\text{-}VI_4$, $I_3\text{-}V\text{-}VI_3$, $I_2\text{-}IV\text{-}VI_3$, and $I_4\text{-}IV\text{-}VI_6$, wherein the native dopant group I elements are, for example, Cu or Ag, or elements that behave similarly, such as Tl; the group III elements are, for example, Al, Ga, or In, or elements that behave similarly, such as Fe; the group IV elements are, for example, Si, Ge, Sn or Pb; the group V elements are, for example, P, As, or Sb, or elements that behave similarly, such as V; and the group VI elements are, for example, S, Se or Te. In a preferred embodiment, the ternary chalcogenide is $CuInSe_2$.

In a still further embodiment of the invention, the semionic material is a doped ternary pnictide semiconductor comprising a native dopant, for example, of the formula $II\text{-}IV\text{-}V_2$ or $I\text{-}IV_2\text{-}V_3$, wherein the native group I elements are, for example, Cu or Ag; the group II elements are, for example, Zn or Cd; the group IV elements are, for example, Si, Ge, Sn or Pb, and the group V elements are, for example, P, As or Sb. Examples of such ternary pnictide semiconductors are $ZnSnP_2$ and $CuGe_2P_3$.

In yet a further embodiment, the semionic material used in the invention is a doped multinary, e.g. a quaternary chalcogenide or pnictide semiconductor comprising a native dopant. Said quaternary chalcogenides may be of formula $(Ia,Ib)\text{-}III\text{-}VI_2$, e.g. $(Cu,Ag)InSe_2$, or of formula $I\text{-}(IIIa,IIIb)\text{-}VI_2$, e.g. $Cu(In,Ga)Se_2$, or of formula $I\text{-}III\text{-}(VIa,VIb)_2$, e.g. $CuIn(S,Se)_2$.

In its simplest form the invention concerns applying an intermittent electric field to the semionic material. The field should be of sufficient strength to change the dopant concentration and create doping profiles, sufficiently sharp to result in device structures, such as homojunctions (p/n junctions), bipolar transistors (p/n/p or n/p/n structures) and the like, on a local scale, said scale being limited at its upper end only by the field strength that can be applied (it has to be sufficient but not to lead to decomposition, either directly, or via the current flow, induced by it) and, at its lower end, also by the spatial delineation of the electric field governed e.g. by the size of the contact.

In a preferred embodiment of the invention, a thermal field, e.g. a thermal gradient, or a standing wave profile, is applied to the semionic, to provide further control over the motion of the dopant that migrates under the influence of the electric field. Such thermal wave pattern can be induced by localized heat sources, by actively cooling part of the material, by means of spatially varying absorption of light with energy $h\nu > E_G$ or by a particle beam, e.g. an electron beam, depending on the spatial scale desired. This embodiment relies on the temperature dependence of the electrical conductivity of the semionic material. Often larger effects can be achieved by relying on the photoconductivity or electron-beam induced conductivity of the material. Thus in one embodiment, an optical interference pattern is created onto and in the semionic causing the occurrence of illuminated regions with higher conductivity and darker regions with lower conductivity. The electric field will now act differently on the regions that are illuminated, than on those that are not illuminated. It can be advantageous at times, to synchronize the electrical field with the additional field. This provides a new way to use the invention for the fabrication of a doping superlattice.

Electromigration of mobile interstitial impurities (Li, Cu) in a high electric field can significantly differ from the drift under the quasi-equilibrium conditions (low field, elevated and homogeneous temperature of semiconductor), described above. We found that at local electric field strengths of $\sim 10^6$ V/cm and local temperature increases of less than 400° C. (semiconductor is kept at room temperature), an extremely non-equilibrium situation is created. This leads to the creation of non-equilibrium, stable, doping profiles in Si which was originally homogeneously doped by Li or Cu.

There are two significant differences between the conditions according to the present invention and the prior art conditions:

1. We start with a homogeneously doped semiconductor which does not contain any pre-created p/n junction;
2. High electric field is applied at room temperature. The process is designed to prevent overheating either by actively or passively cooling the material, or both. No additional heat source is required.

The results according to the present invention indicate that E-field induced device creation at low to moderate local, and low bulk sample temperature, is a general phenomenon in semiconductors with sufficiently mobile impurities. A real transistor structure is thus created in the semionic material. In Si:Li type conversion occurs at high fields rather than the compensation that is found at lower fields.

In one embodiment of the invention, micrometer-sized homojunction structures can be formed by local application of strong electric fields ($\sim 10^6$ V/cm) at ambient temperatures to Si which was homogeneously doped n-type by Li. Such junctions show electroluminescence and two such junctions, arranged back to back, act as transistors, as evidenced by electron beam induced current (EBIC), current-voltage and capacitance-voltage measurements.

Electronic device elements created in the semionic material according to the present invention are transistors, diodes and thyristors. Examples of optoelectronic devices are light emitting diodes (LED), phototransistors and radiation detectors. Two light emitting diodes created in one crystal can be used as an optocouple or an optical switch. Combined (multi-element) device elements created according to the invention are light amplifying optical switch (LAOS), a combination of transistor and LED, and individually addressable radiation detection element, a combination of radiation detector and transistor.

The invention is illustrated by way of example with reference to the schematical drawings, not according to scale.

BRIEF DESCRIPTION OF THE DRAWINGS

FIGS. 2B–F are current-voltage-capacitance graphs showing aspects of the operation of set-up shown in FIGS. 2 and 2A and the results.

PREFERRED EMBODIMENTS OF THE INVENTION

These will be described with the aid of the Figures.

Figure 1A:
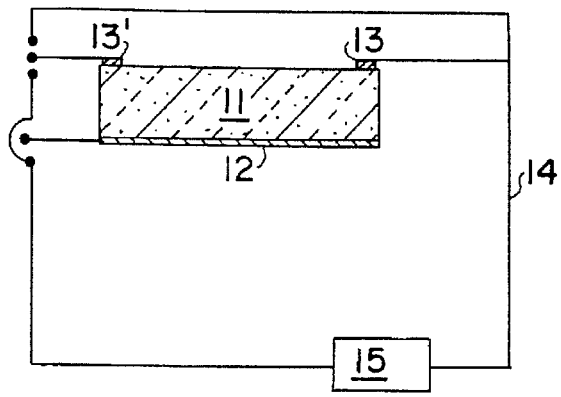
FIGS. 1A and 1B are a sectional side view and a perspective view of an experimental set-up for the application of an external electric field to a semionic sample.
Figure 1B:
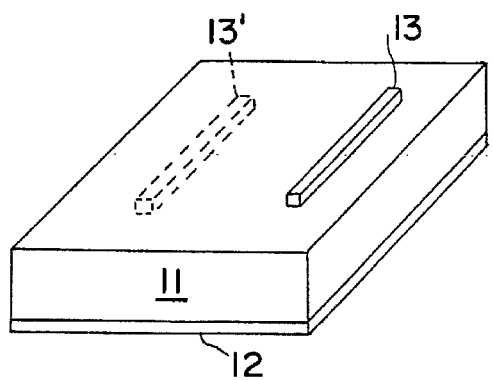

In FIG. 1 a preferred embodiment is shown to create a p/n junction in an originally homogeneous semiconductor (11), by applying a voltage between contacts 12 and 13 (which can be ohmic or non-ohmic), using power supply 15, via leads 14. The junction will be created around contact 13, its exact location depending on the duration and magnitude of the applied voltage and the original electronic properties of 11. Junction creation (and propagation) will become particularly pronounced when the system is brought into a condition of reversible breakdown, i.e. without causing damage to the semiconductor (e.g. by uncontrolled thermal instability). If desired, a multiple structure can be created by using two top contacts 13 and 13', or the voltage can be applied between 13 and 13' only. It is also possible to use one continuous top contact 13. FIG. 1A (top) is a top view, while FIG. 1B (bottom) is a perspective view.

Figure 2:
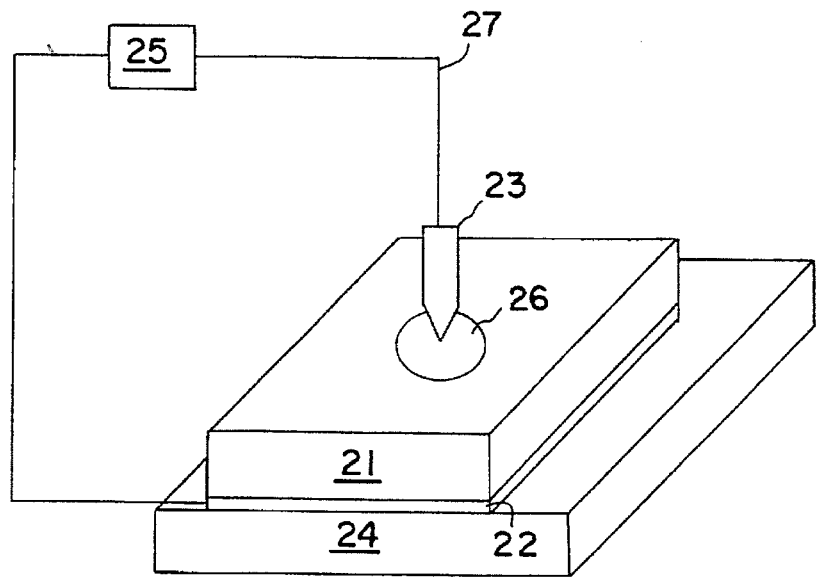
FIG. 2 is a perspective view of an experimental set-up for the use of a point contact to create a hemispherical junction.

As shown in FIG. 2, a voltage is applied, by source 25, via point contact 23 and large area contact 22 to semiconductor 21, via leads 27. Semiconductor 21 is mounted on substrate 24. As a result a hemispherical junction is created between type-converted region 26 and the remainder of semiconductor 21.

When an electrical potential difference, $\Delta\phi$, is imposed across a mixed conductor, decomposition (formation of a stable second phase) can occur when $\Delta\phi > Eo$, the minimum decomposition potential. Processes, that do not lead to chemical decomposition, can occur when $|\Delta\phi| < |E|$, where E is the actual decomposition potential. While for a semionic material one is particularly interested in the latter ones, it is instructive first to consider briefly decomposition processes. One notes that, solid state electrochemically, one is considering a cell with two ionically blocking, electronically conducting electrodes. Since, in this case the constituent's chemical potentials, $\mu$, are undefined, effects of applying a voltage across a sample depend on its defect chemistry.

Decomposition processes can be described by considering the point electrode configuration, shown schematically in FIG. 2. Application of $|\Delta\phi| > |E_i|$ with the point electrode configuration, can result in one of two irreversible decomposition reactions, depending on the polarity of the point electrode (signs of $\Delta\phi$ are with respect to the point or small area electrode).

Oxidative decomposition occurs when a strong positive bias, $+\Delta\phi$, is applied to the point electrode ($\Delta\phi > E^+$), ionic current can flow towards the large area, counter electrode. At sufficiently high voltages, oxidative decomposition can take place on the point electrode.

Reductive decomposition occurs when precipitation of the mobile metal (A) takes place on the semiconductor surface near the point electrode ($-\Delta\phi < E^-$), when a strong negative bias, $-\Delta\phi_A$ is applied to the point contact. This can occur as the result of electromigration of point defects to the surface and their subsequent neutralization. The result will be to leave a phase, which, all other factors being equal, should be more n- or less p-type, around the point electrode, than the original material.

The process starts when the difference in electrochemical potential of the A ion ($\Delta\mu_{A^+}$) across the sample, is positive; $\Delta\mu_{A^+} = \Delta\mu_A + F\Delta\phi$, where $\mu_A$ is the chemical potential of A and $\Delta\mu_A = FEo$. For an ideal reversible process, this will be the case when $$\Delta\mu_{A^+} = F(\Delta\phi - Eo) > 0 \qquad (1)$$

In the set-up of FIG. 2 the actual E values are much higher than Eo ones (several volts, at room temperature, for 1–2 mm thick samples) and depend on the bulk and surface quality of the materials. This is the case of supersaturation. Materials with better crystalline quality will have higher overpotentials (E-Eo) for the decomposition reactions and thus, processes, that do not lead to decomposition, will be more likely in them. By including the overpotential eqn. 1 becomes $$\Delta\mu_{A^+} = F(\Delta\phi - E) > 0 \qquad (2)$$

$\Delta\mu_{A^+}$ depends, $\Delta\mu_A$, on the duration of the experiment. If a point electrode is used, then decomposition is readily detected by a rapid increase in current, caused by an increase in effective area of the point electrode.

Processes, below the decomposition potential ($|\Delta\phi| < |E|$) can occur in addition to, or instead of decomposition reactions, mainly as a result of A ionic mobility, when $|\Delta\phi| > |E_A^{min}|$, where $E_A^{min}$ is the minimum potential needed for A ion migration. In mixed conductors with structural disorder, such as $Ag_2S$, $\mu_{A^+}$ is taken as constant across the sample, in the absence of an external potential. For a semionic material, such as $CuInSe_2$, this is not necessarily so since, while the high chemical diffusion coefficient, D, of Ag$^+$, even in $\alpha$-Ag$_2$S leads to fast relaxation (seconds), D(Cu$^+$) in CuInSe$_2$ is much smaller. This means that, once the external driving force for migration is removed, the Cu ions that drifted can become trapped quickly.

In the simplest small current case ("classical" migration), the A ion starts to migrate towards a negatively polarized point electrode when $$F\Delta\phi - \Delta\mu_A + > FE^{min} \qquad (3)$$

This leads to an increase $\mu_{A^+}$, which results in changes in composition in a small volume near the point contact. This process is driven by a Coulomb force, $F_d$, given by $$F_d = Z_d \cdot q \cdot E \qquad (4)$$

where $Z_d$ is the (effective) valence of the migrating defect, q the electronic charge and E is the electric field. Since the migrating species is a dopant, changing its concentration leads to changes in $N_a/N_d$ (ionized acceptor/donor density), close to the point electrode, and thus to changes in the net electronic carrier concentration, $n_c$, which will be expressed in the electronic conductivity, $\sigma_e(\alpha n_e)$. Steady-state conditions are obtained when inequality (3) is not anymore valid and $$F\Delta\phi - \Delta\mu_A + = FE_A^{min} \qquad (5)$$

As long as no type conversion occurs this process forms the basis for the determination of D from the decay of the current, at constant voltage, that flows between the point and counter electrode.

Indeed, one can observe, at room temperature, the above described behavior, typical of a mixed electronic and ionic semiconductor. For instance, in a p-type sample $\sigma_e$ will decrease after prolonged negatively biasing of the point electrode (up to several volts, depending on the sample). This can be explained by an increase in $N_d$, and/or a decrease in $N_a$, at the cathode (point electrode). This will result in a higher compensation state of the p-type material close to this electrode, which will decrease $\sigma_e$. Such behavior leads to a smoothly varying dopant gradient.

The high current at high field case i.e., that of a semiconductor responding to an external field similar to a classical mixed, ionic and electronic conductor, changes with increasing field strength, if, in addition, high current density passes (of the order of A/cm$^2$) or more. The high currents result from reversible electrical ("soft") breakdown, i.e. breakdown that does not lead to decomposition.

Under strong reverse bias current can flow by way of impact ionization. In such case the carriers are hot and their relaxation, via phonons, will lead to highly localized temperature increases, $\Delta T$. Since D~ depends exponentially on temperature, the above-mentioned increase in local temperature can facilitate electromigration in the junction region, which is the region where $\Delta T$ will be largest, i.e. the local temperature of that region can be well above that of the ambient. This means that D can be much higher inside than outside this region. This will be true only as long as this region is sufficiently depleted of carriers, so that screening effects do not outweigh the increase in D.

Figure 2A:
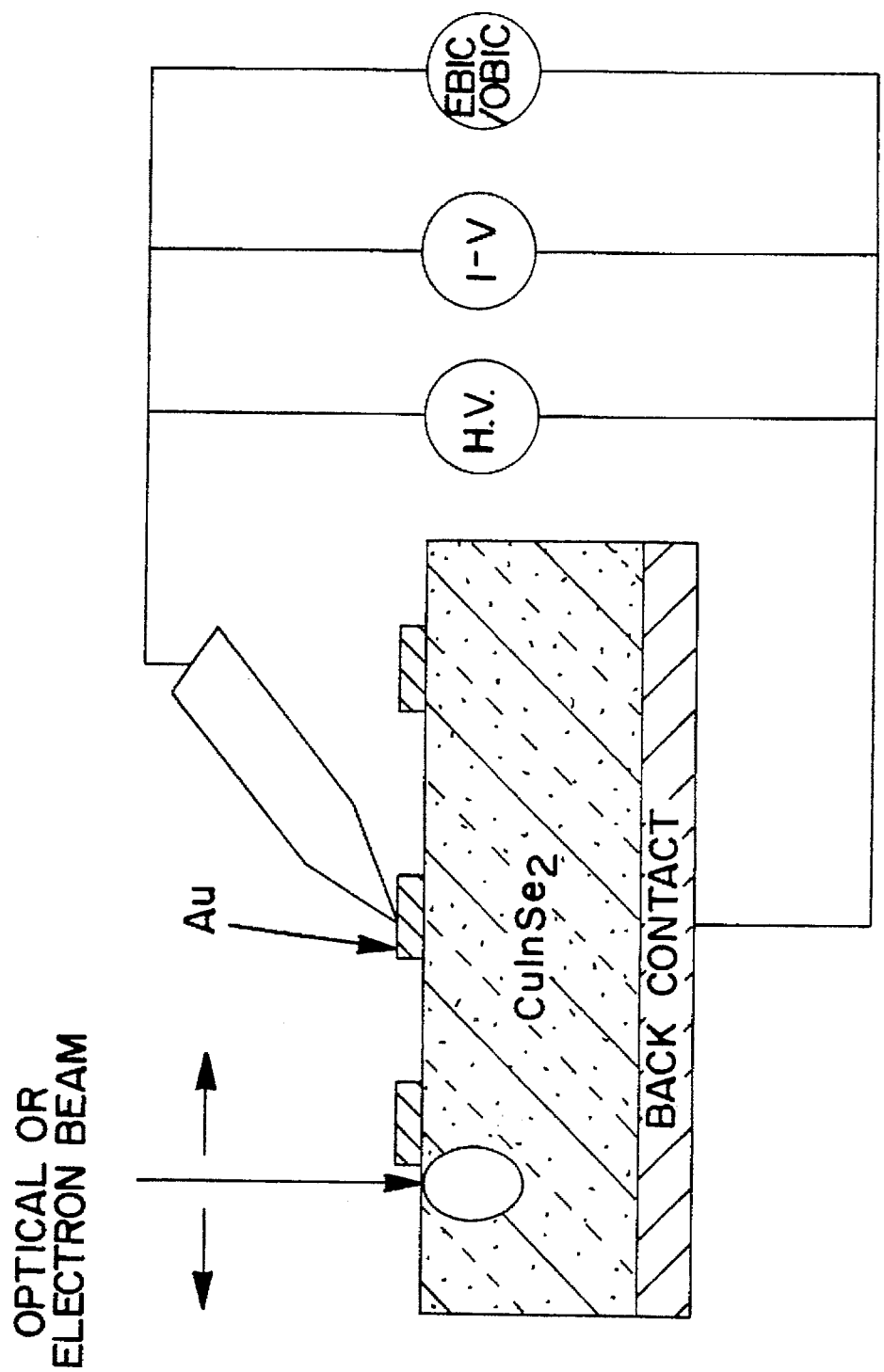
FIG. 2A is a sectional side view of the experimental set-up of FIG. 2.
Figure 2B:
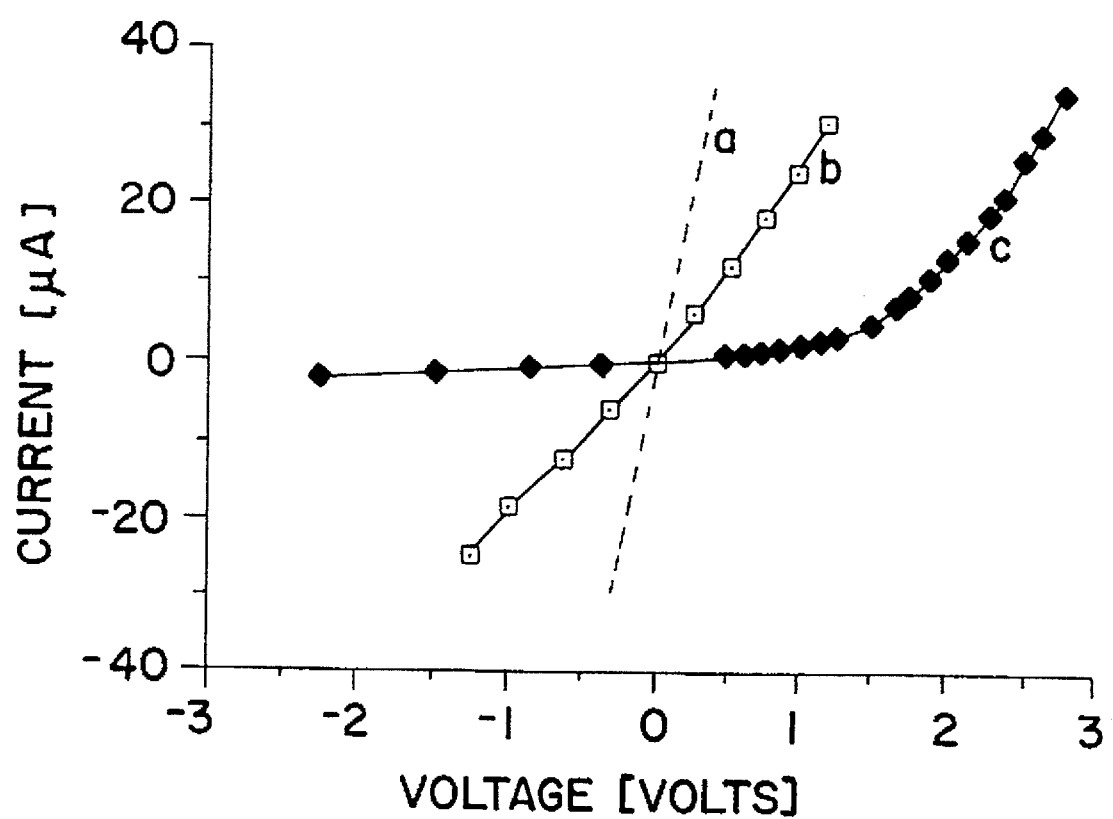

The effects of applied electric field, and resulting current flow, can be conveniently monitored in several ways (FIG. 2A). By scanning an electron or optical beam across the relevant (treated) area of the sample, one can use electron- or optically-induced current flow (EBIC or OBIC) to map the changes, as they occur, in the way that they show up at the surface. FIG. 2A shows this in a schematic fashion. H.V. stands for high voltage. It shows two of the ways to achieve high level fields viz. use of an inert point contact (e.g. Au or Pt or W) and a small dot, of inert conducting material, deposited on the surface. The size of the point contact or dot can be increased for as long as the resulting electric field is sufficient to change the dopant concentration. It can be decreased down to nm size. The contact does not need to be in direct touch with the semionic and field-emission effects can be utilized, as well to establish the electric field inside the semionic, while still allowing for current flow. Other methods to monitor the effects of the electric field are voltage contrast (using a scanning electron beam) and, current-voltage curves (I-V). This latter possibility is illustrated in FIG. 2B. This shows the I-V curves obtained from an original ohmic contact made to an originally homogeneous sample of n–CuInSe$_2$ (a), which was subsequently biased with the point contact as anode (b) and as cathode (c) at room temperature. The applied voltages and currents were adjusted during the process (cf. FIG. 2C), up to several volts and several µA's for several minutes. EBIC shows that the changes, in the case of a 10–50 µm diameter contact, can extend from 50–200 µm outside the contact area, laterally and in depth.

In addition to in situ EBIC (and voltage contrast) measurements the electronic effects of the treatments are expressed macroscopically as changes in the shape of the I-V curves. By correlating the changes in I-V characteristics with OBIC/EBIC data, it is possible to adjust in situ the experimental conditions in order to achieve a certain type of doping profile. There are three general types of changes:

(i) change in resistance observed as change in the slope of a linear I-V curve;

(ii) change, with time, from an initially linear (ohmic), to a non-linear or diode-like I-V curve;

(iii) change of shape of originally non-linear or diode like I-V curve.

The character and intensity of the introduced modifications are dependent on:

(i) the initial electronic properties of the sample, i.e. resistivity, conductivity type, on its defect chemistry (concentrations of defects) on the quality of the surface and on the presence of structural defects such as dislocations;

(ii) the type of the contact used (ohmic or Schottky);

(iii) the applied voltage (polarity, amplitude, frequency and form of a.c. voltage);

(iv) the sample's temperature.

Figure 2D:
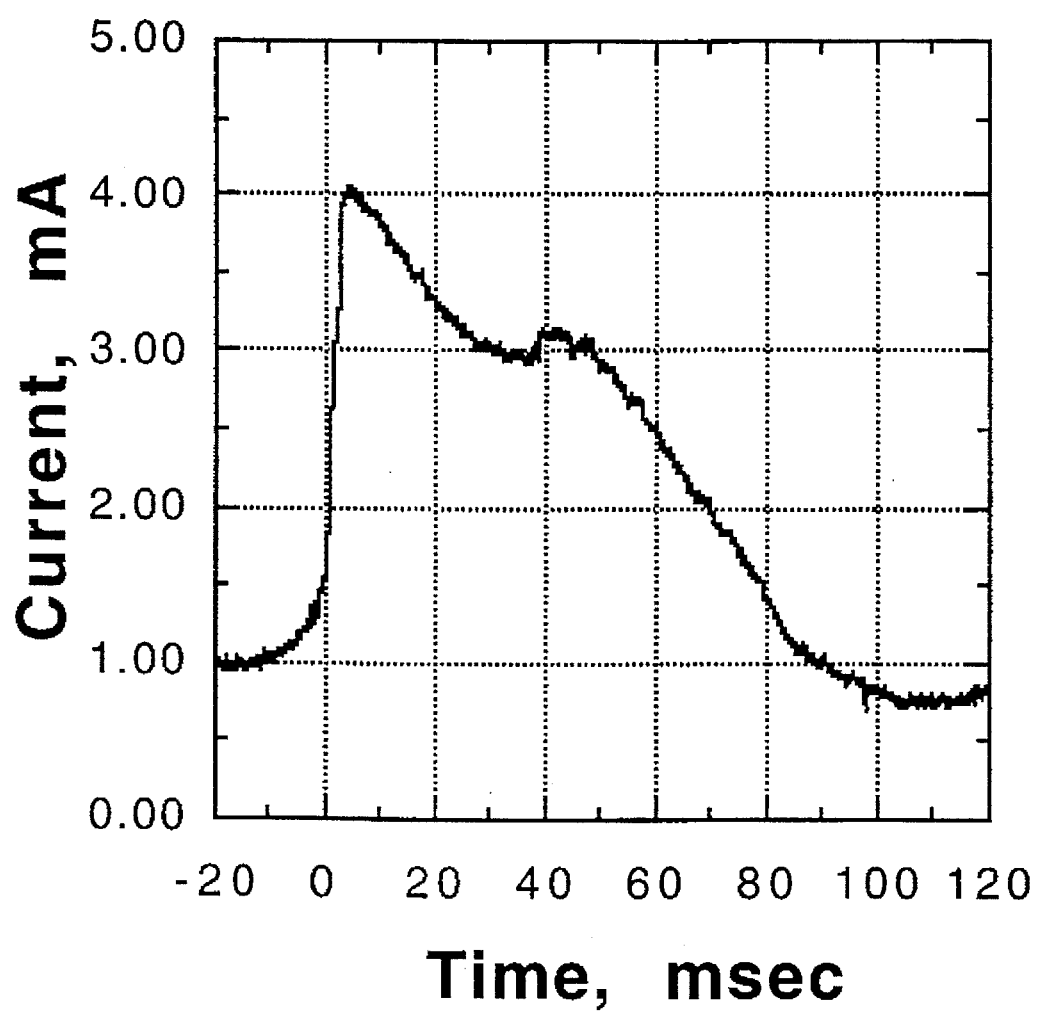

FIG. 2C illustrates the course of a typical experiment, showing I-V curves in reverse direction, measured during the application of bias to a 50 µm Au contact/p-CuInSe$_2$/ large area electrode structure (cf. FIG. 2A). Pulses of DC high bias voltage (up to 500 V; 8 msec duration) followed by saw-like low voltage pulses (from –5 v to +5 V; ~12 msec duration) were used here. The applied voltage is increased gradually until it reaches a critical value at which the current that passes through the semiconductor increases sharply. Even if this value were known beforehand, immediately applying it to the sample has the danger of causing irreversible breakdown, and accompanying uncontrollable thermal phenomena, that may lead to sample decomposition. In all of the experiments that are described here, such situations were avoided and no evidence could be found for sample decomposition or melting. The current increase persists for ~20–110 msec after exceeding the critical voltage and takes the current from a steady state value of less than 1 mA to a peak value of ~10–15 mA. This current spike coincides with strong hysteresis in the high voltage—current curve. In FIG. 2C1 and FIG. 2C2, we show I-V curves in the low- and high-voltage regime before (curves a,b) during (curves c,d) and after the spike (curves e,f). In FIG. 2C1 and FIG. 2C2, curve b, the high voltage is just below the value needed for inducing the current spike and hysteresis; FIG. 2C1 and FIG. 2C2, curve a, shows a low voltage I-V curve of a Schottky barrier under investigation before the current spike. Increasing the high voltage slightly leads to hysteresis in the high voltage I-V curve (FIG. 2C1 and FIG. 2C2, curve d). This hysteresis can be due to the displacement of ions. Only a small effect is seen in the low voltage I-V curve (FIG. 2C1 and FIG. 2C2, curve c) that is recorded immediately after it. However, already during the next cycle (>22 msec) the low voltage I-V curve (FIG. 2C1 and FIG. 2C2, curve e) differs significantly from that corresponding to the original Schottky barrier (FIG. 2C1 and FIG. 2C2, curve a). Within ~44 msec the high voltage I-V curve (FIG. 2C1 and FIG. 2C2—curve f) reverts to the pre-spike one, shown in FIG. 2C, curve b. EBIC shows that the I-V curves of FIG. 2C1 and FIG. 2C2, curves a & e correspond to Schottky diode (cf. FIG. 2E1) and p/n/p structures (cf. FIG. 2E2), respectively. When the continuously applied voltage reached a certain critical value, a current spike occurred during ~10–100 msec. One such spike is shown in FIG. 2D. The shape of this current-time plot can be explained if we assume that the system shows self-limitation, i.e., current during the spike decreases without a decrease in applied voltage. This means that significant changes occur in the local electrical properties of the semiconductor. Indeed, we detected by EBIC the creation of a transistor structure, immediately after the spike, also in this experiment. When a continuous voltage is used, the momentary current increase is always less than that obtained with a periodic excitation (cf. FIG. 2C). In FIG. 2D, triggering occurred at 0 msec. Negative time corresponds to the pre-triggering period. Note that time 0 does not coincide with the time of the process initiation, which starts ~10 msec before the triggering.

Figure 2E:
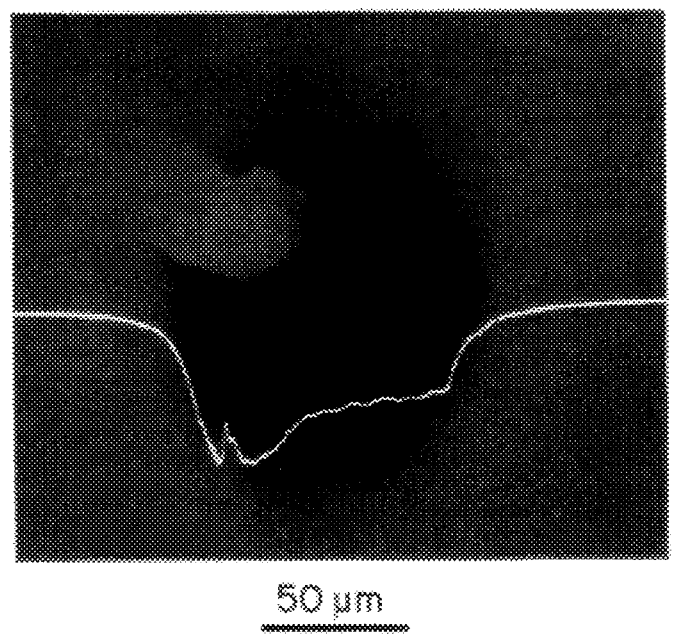
Figure 2E:
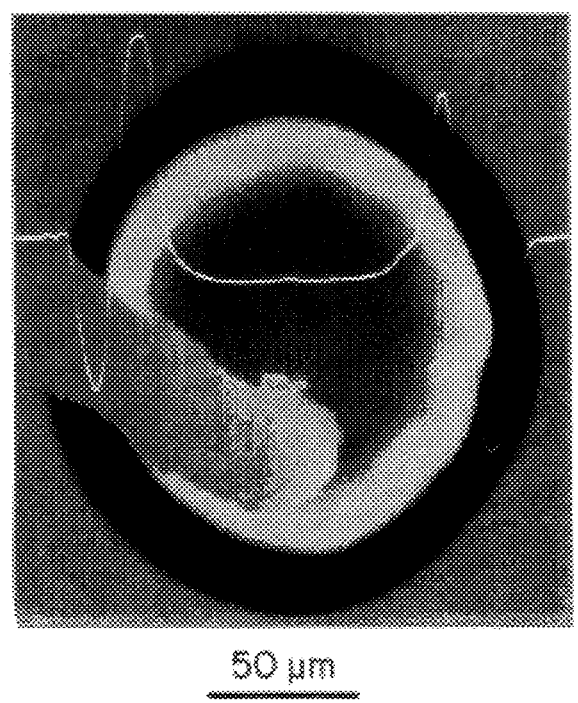

FIG. 2E1, shows EBIC-contrast and EBIC line-scan of 50 μm diameter gold top contact before voltage application to it; FIG. 2E2, show EBIC-contrast and EBIC line-scan of the transistor created by applying ~21 V in reverse direction to this gold contact.

FIG. 2E3, shows the I-V characteristics obtained with structure corresponding to curve e, FIG. 2C, by exciting the external junction of the structure with the electron beam. The beam current was varied by varying the spot size, from 0 nA (a, dark, i.e. without electron beam excitation) to 5.2 to 5.7 to 6.2 to 6.8 nA. The beam currents were measured by way of a Faraday cup. Absorbed currents were, as a rule, 60% of the measured beam currents.

The device response indicates that relatively sharp junctions are formed sufficiently so as to yield amplification of current action.

An additional possibility for obtaining a device structure with pre-determined properties is to synchronize a photon beam with the low voltage part of the waveform, to follow the evolution of I-V characteristics, e.g. phototransistor behavior. In this case it is also possible to intersperse a number of low voltage ramps instead of only one, and to move the photon or particle beam, so as to obtain I-V characteristics for each position of the beam. True phototransistor action was observed when the base of a p/n/p structure, created in a sample of $Cu_{0.95}Ag_{0.05}InSe_2$ was illuminated by a He-Ne laser (632.8 nm), whose 10 mW beam was focused to a spot of ~5 μm diameter. I-V curves were measured between the top and back contacts (cf. FIG. 2A) as a function of illumination intensity. The intensity of the laser beam was controlled by neutral density filters and measured by a laser power meter. I-V measurements showed the structure to function as a transistor. This became especially clear from the observation that the quadrant in which the phototransistor action is observed, changed with the locus of excitation. Actual amplification was estimated as explained in D. Cahen, et al., 1992, Science, 258, 274. An increase in laser beam intensity 3% increased the device current by 350%.

Further support for creation of a p+/n/p structure in the bulk of the material, as a result of E-field application, comes from capacitance-voltage (C-V) measurements performed on sample C, using both E-field treated and virgin gold contacts. FIG. 2F1 and FIG. 2F2 present the C-V characteristics of a virgin contact, before E-field application, at 1 MHz. The shape is typical of a Schottky diode, i.e., decreasing capacitance with increasing reverse bias (positive voltage in FIG. 2F1 and FIG. 2F2, corresponds to a positive top gold contact). The 1 MHz C-V characteristics, using an E-field treated contact, are presented in FIG. 2F3 and FIG. 2F4. Their shape is typical for a double junction, which means, in our case, a p/n/p structure. We were not yet able to test each of the junctions separately, because of the problem to contact the middle region which is only a few μm wide. Therefore C-V measurements were made contacting the two outer regions. If we view the structure as a transistor then we are measuring $C_{CE}$ as a result of applying voltage $V_{CE}$. $C_{CE}$ mostly decreases with an absolute increase in $V_{CE}$. This can be explained by the presence of two, back to back connected junctions. But when $V_{CE}$ is between −3 to −5 Volt we observe a slight increase of $C_{CE}$. We ascribe this to increased leakage current through the reverse biased p+/n junction, which leads to a voltage drop across the junction, a decrease in the width of the space charge region and, therefore, a slight increase in total capacitance. A maximum capacitance is observed at 0.6 V rather than at 0 V. This can be understood if we assume that the two junctions that make up the structure, are not equivalent in terms of the width of their space charge regions and built-in potentials, which is the case if one is p+/n and the other n/p. In FIG. 2F5 and FIG. 2F6; and we show the C-V characteristics of a commercial n/p/n transistor, with the emitter and collector as contacts, taken at the same frequency, but with reversed polarity. The similarity to FIG. 2F3 and FIG. 2F4, supports interpreting the EBIC images and I-V characteristics of the E-field created structure as being due to p+/n/p-like structures.

An additional mode of process control is the use of OBIC or EBIC in between the high voltage applications.

The frequency of applying the high voltage (H.V.) can vary from 1 Hz to several Hz. Preferably, it will be above 25 Hz and below 100 Hz. The high voltage is applied in a unipolar fashion with a duty cycle of 50% or less. The amplitude will be up to 1000 V.

When current increase starts, indicating the beginning of electrical breakdown, the process is stopped to allow current decrease, to the level of reverse saturation current or close to it, so as to avoid thermal breakdown, which would have been induced by continuing the voltage increase, that originally led to the current increase.

Alternatively, current flow limited in time and space, can be induced by exposing the semionic material during the high voltage application (before electrical breakdown, i.e. before appreciable current flow starts) to photon or particle beam pulses. Such pulses will have a duty factor (with respect to the high voltage region) of one percent or less.

Figure 3A:
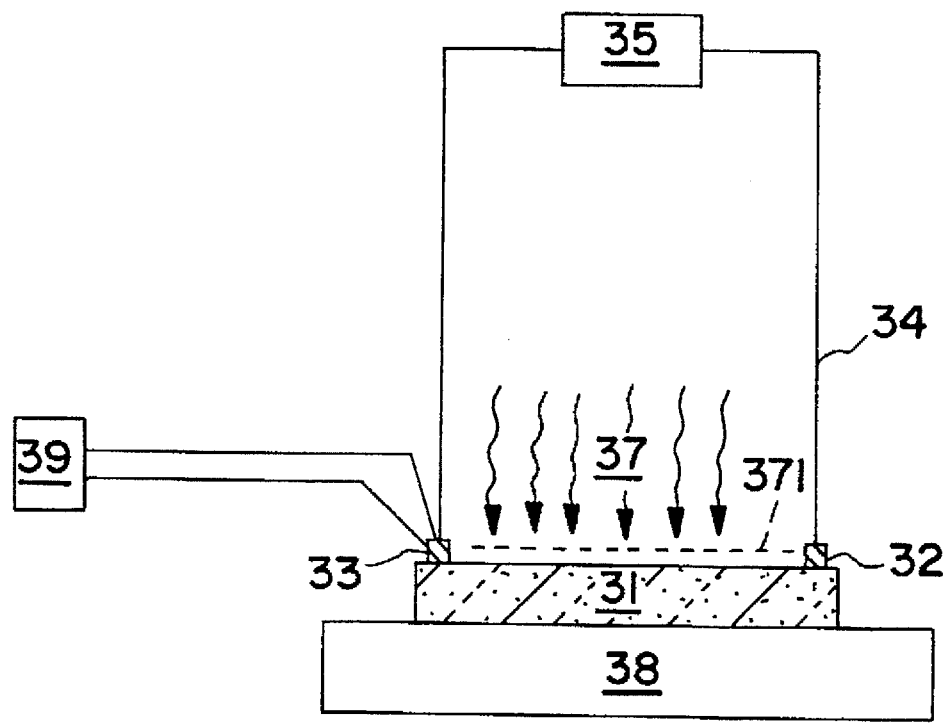
FIG. 3A and 4A are side views, in section, illustrating two possibilities for the simultaneous application of an electric field and an optically created thermal wave and/or photoeffect pattern to a semionic plus the electrical resistivity profile in the semionic that is thus created.
Figure 3B:
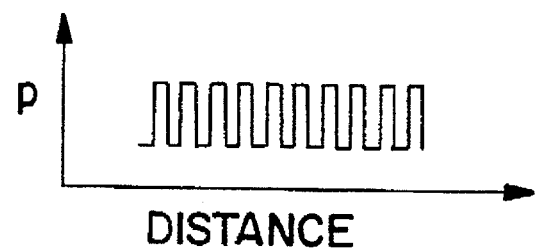
(FIGS. 3B and 4B).

FIG. 3A illustrates a preferred embodiment where a voltage is supplied by source 35 via leads 34 and contacts 32, 33 to semiconductor 31, which is mounted on a heat sink 38. 38 can also be cooled actively, e.g. it can be a thermoelectric element. In addition an electromigration field can be applied (37) via mask 36, resulting in a resistivity profile, in 31, as shown in FIG. 3B. This profile can result either from the thermal effects of the optical field, or from photoconductivity, or both. Alternatively or in addition, a thermal field can be applied via contact 33, using current source 39. This field can be a simple profile, when 33 is heated continuously (and/or 38 is cooled continuously) or a more complicated one, when heating and/or cooling varies with time.

Figure 4A:
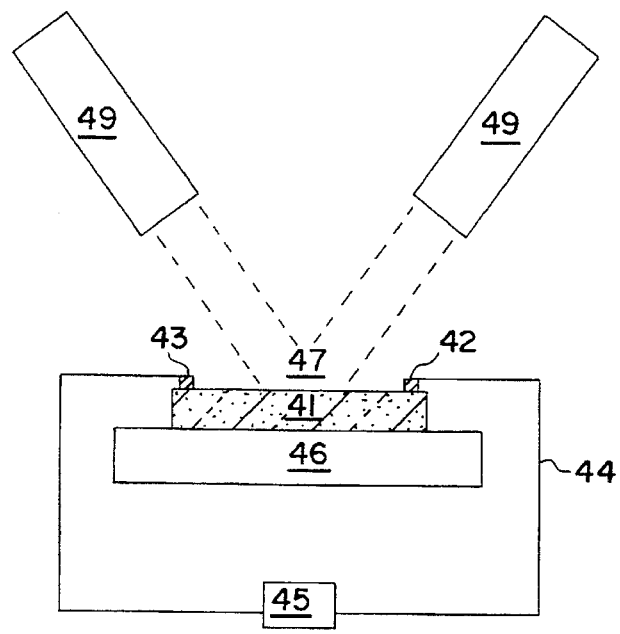

FIG. 4A shows a preferred embodiment where an optical interference pattern 47 is imposed on semiconductor 41, by two optical sources 49, while a voltage is applied from source 45, via leads 44, between contacts 42 and 43, in 41, resulting in a resistivity profile in semiconductor 41. This is shown schematically in FIG. 4B, where the resulting resistivity changes are plotted along the length of semiconductor 41. Alternatively, one of the sources 49 can be a particle beam source, resulting in carrier excitation and/or heating in 41.

Figure 5A:
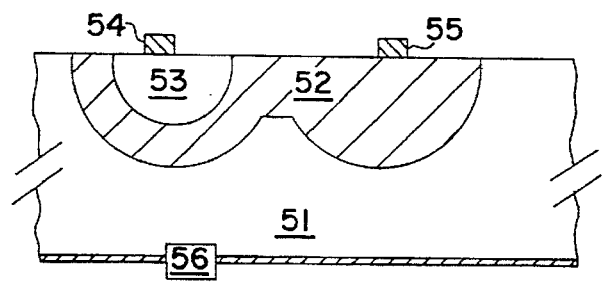
FIGS. 5 and 6 are sectional side views, illustrating the creation of n/p/n structures in a semionic.
FIG. 5B shows a voltage divider circuit usable to obtain a structure as shown in FIG. 5A.
Figure 5B:
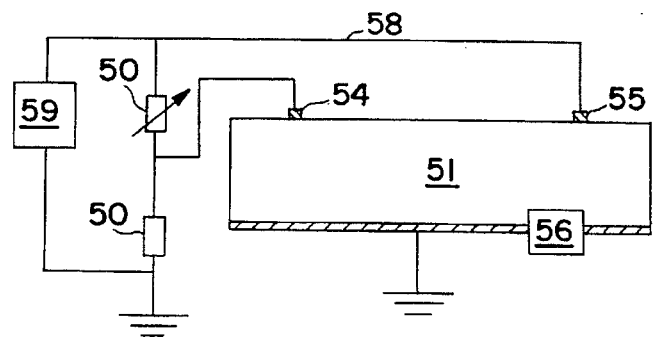
Figure 6:
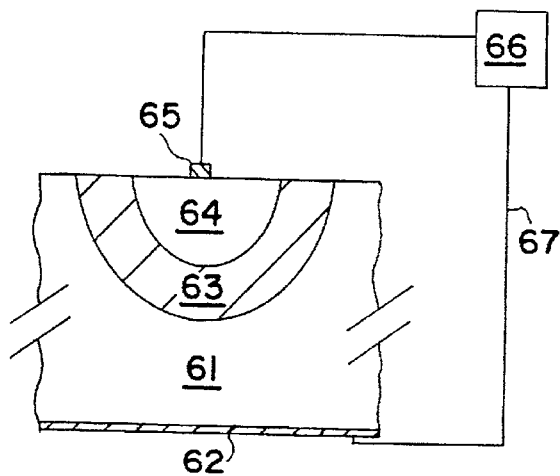

FIG. 5A illustrates a preferred embodiment where a voltage is applied using source 59, via leads 58 and contacts 54, 55 and 56, to semiconductor 51. If initially both contacts 54 and 55 are used, a region 52 is created with changed electronic properties. If now a suitable voltage divider (50) is used, as shown in FIG. 5B, the voltage between contacts 54 and 55 will create region 53, leaving the junction between 51 and 52 intact and thus leading to a transistor-like structure with 53 as the emitter, 52 as the base and 51 as the collector.

In FIG. 6 a preferred embodiment is shown that is similar to that described in FIG. 5, with 61 being the semiconductor, 62 the large area contact, 65 a point contact, 67 the leads and 64 and 63 being the regions with changed electronic properties.

Figure 7:
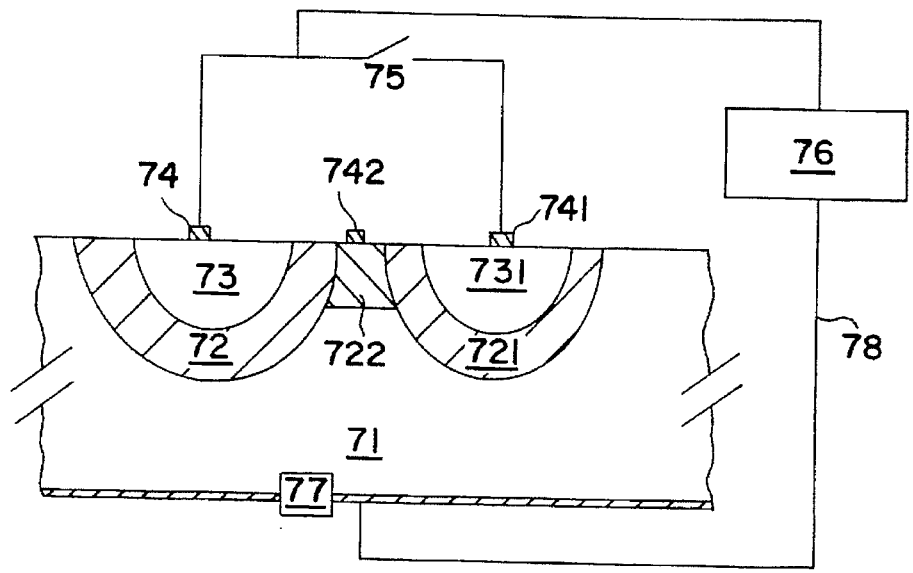
FIG. 7 illustrates the creation of a more complicated structure in a semionic.

In FIG. 7 a preferred embodiment is shown that illustrates a step in the fabrication of more complicated devices. A voltage is applied to 71, via contacts 74 and/or 741, and via contact 77 and leads 78, from source 76. If 71 is n-type, then by controlling switch 75, a multiple /n/p/n/ structure is created formed by regions 71, 72, 73, 721 and 731. Contact 742 can be added to create region 722 and so on.

Figure 8:
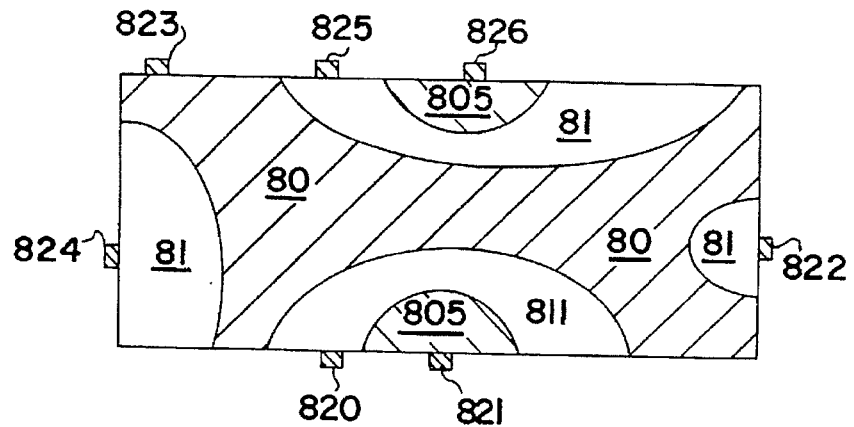
FIG. 8 illustrates a step in the creation of a three dimensional structure in a semionic.

FIG. 8 illustrates a cross-sectional, schematic view of a preferred embodiment that shows a step in the fabrication of a 3-dimensional device, utilizing steps such as those outlined in FIGS. 5 and 7. Electric voltages are applied, according to need, to contacts 821, 822, 824 and 826 to create type-converted regions 81 and re-type-converted regions 805. If needed, region 81 and/or 811, for example, can be made highly resistive, by compensation, via proper choice of the time and magnitude of the potential that is applied between contacts 821 and 823/824/826. It can be contacted using contacts 820 (825 for region 81). Thus, if the original material 80 was n-type, p/n, n/p/n, n/p/n/p/n and n/p/n/i/n structures can be created in this way.

Figure 9A:
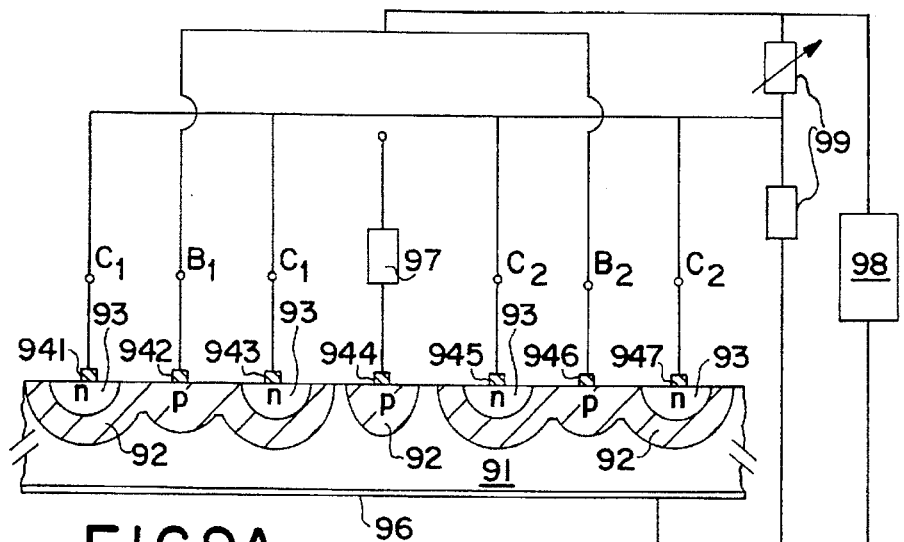
FIGS. 9A–B illustrate a step in the creation of an $I^2L$ logic gate structure in a semionic.
Figure 9B:
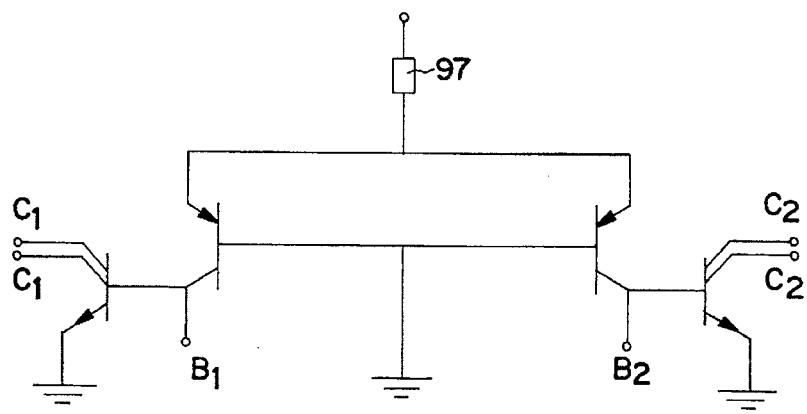

In FIG. 9A a preferred embodiment is shown that illustrates a step in the fabrication of a logic gate in $I^2L$ technology. Its schematic electronic circuit is shown in FIG. 9B. The active regions were obtained as a combination of the processes explained in Example III and FIG. 5. In FIG. 9A, 941, 942, 943, 944, 945, 946 and 947 are contacts. Of these, 941, 943, 945 and 947 are connected in parallel, and 942, 946 are connected in parallel; 96 is their common back contact; 98 is the power source; 99 are fixed and variable resistors; 97 is a fixed resistor. C1 (C2) are collectors 1 and 2, B1 (B2) are bases 1 and 2.

Figure 10:
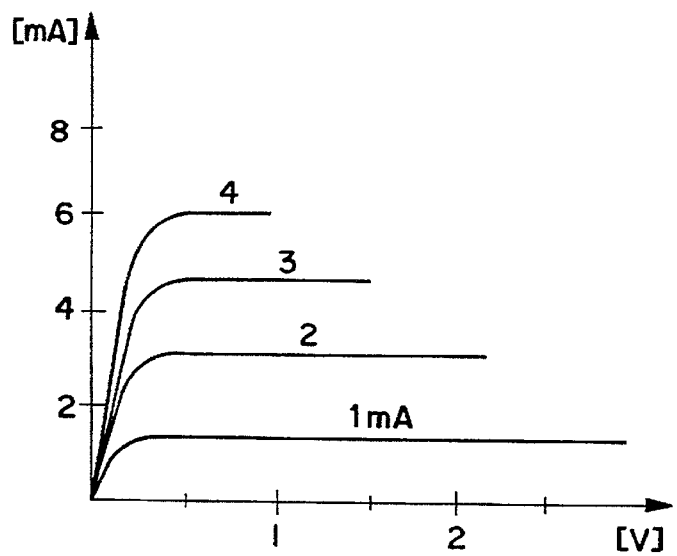
FIG. 10 illustrates the I-V characteristics of a transistor structure created in a semionic, according to FIG. 5.

FIG. 10 shows the current-voltage characteristics of the structure shown in FIG. 5A where the voltage is measured between contacts 54 and 56, and the current flows between 54 and 56. The currents shown on the curves (in mA) are those injected between contacts 55 and 54.

Figure 11A:
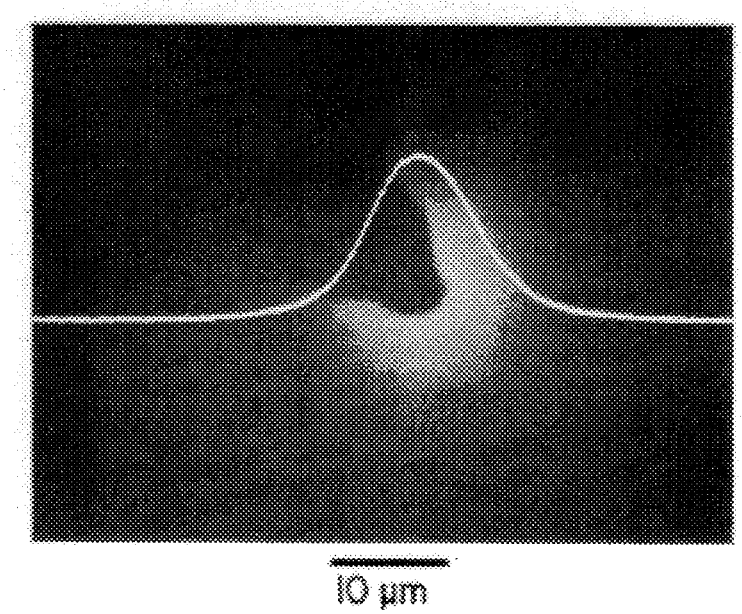
FIGS. 11A–C illustrate the changes in the EBIC contrast before and after electric field application to the Si doped by Li (Si:Li).
Figure 11B:
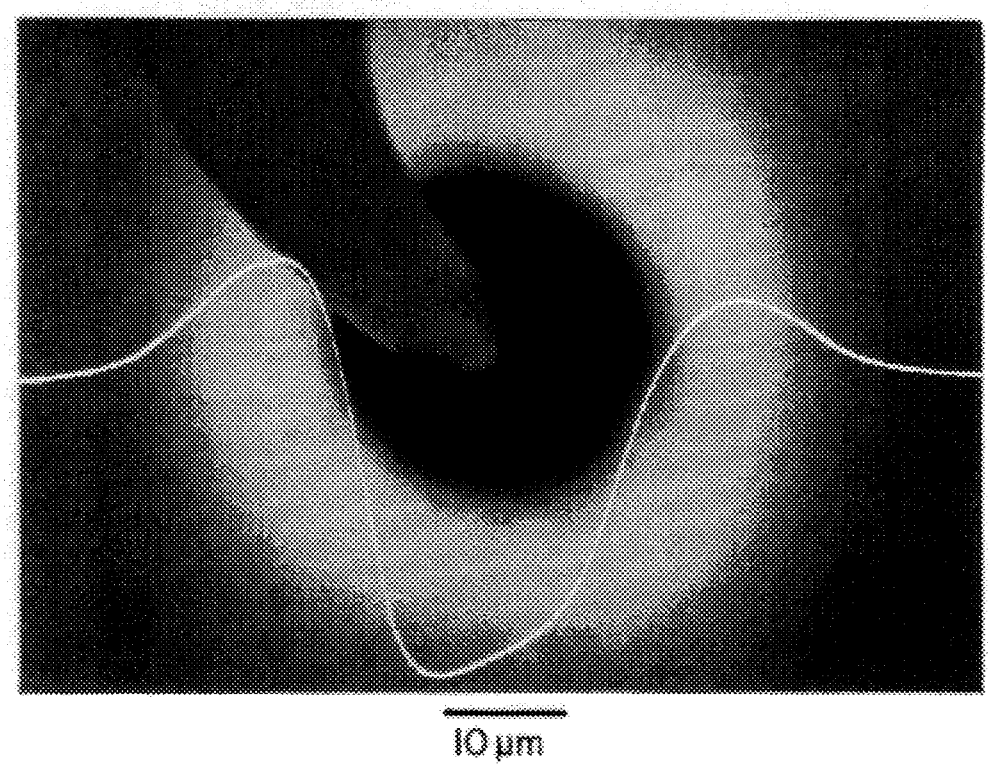
Figure 11C:
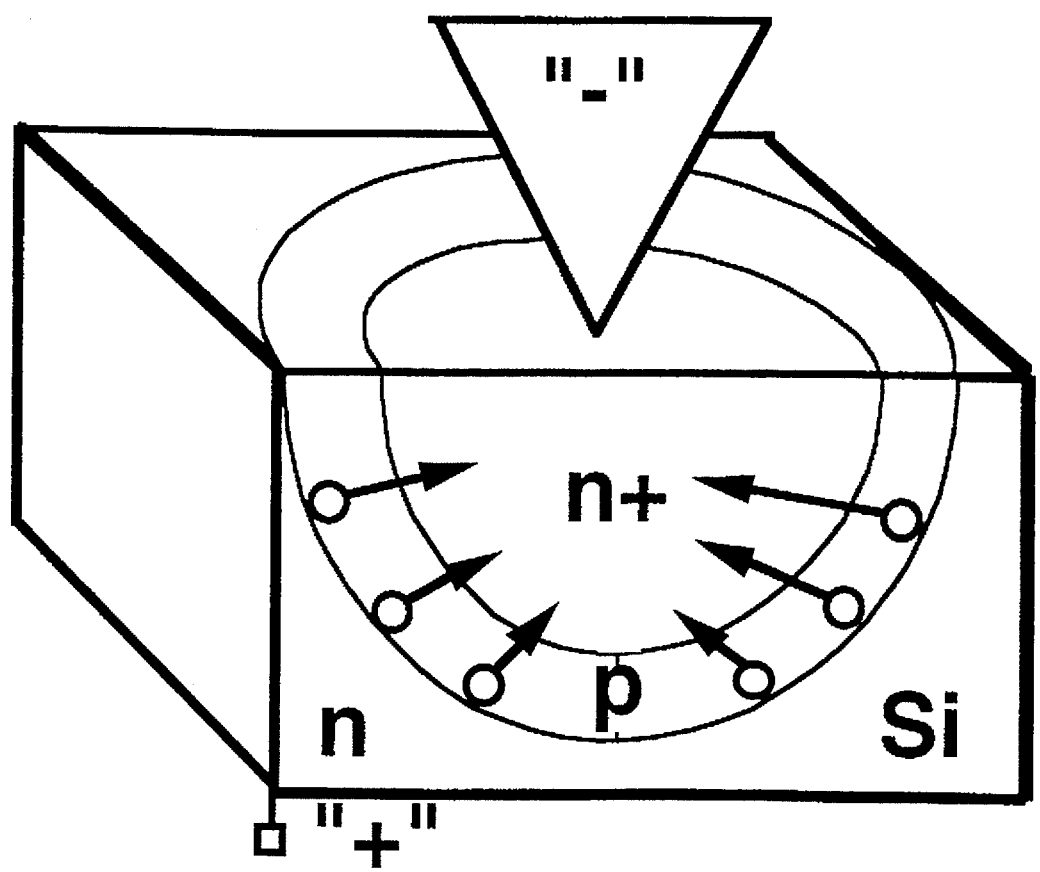

FIGS. 11A–C show the EBIC contrasts before and after electric field application and a schematic explanation of structure creation in Si:Li. Electrical parameters of Si:Li sample are: $n=5 \cdot 10^{14}$ cm$^{-3}$; $\mu=1650$ cm$^2$/V.sec; $\rho=10\Omega$.cm. SEM (scanning electron microscope) accelerating voltage 30 kV; electron beam spot size 100 nm; magnification 1300×.

FIG. 11A. Initial EBIC contrast and superimposed EBIC line-scan corresponding to a W(tip)/Si:Li barrier.

FIG. 11B. EBIC contrast and line-scan of the E-field-induced structure. Black EBIC contrast (negative EBI-current on the line-scan) corresponds to $n^+$–p junction (cf. FIG. 11C); white EBIC contrast (positive EBIC on the line-scan) corresponds to p/n (bulk of semiconductor) junction.

FIG. 11C. Schematic explanation of structure creation. Arrows represent the direction of Li electromigration.

Figure 12:
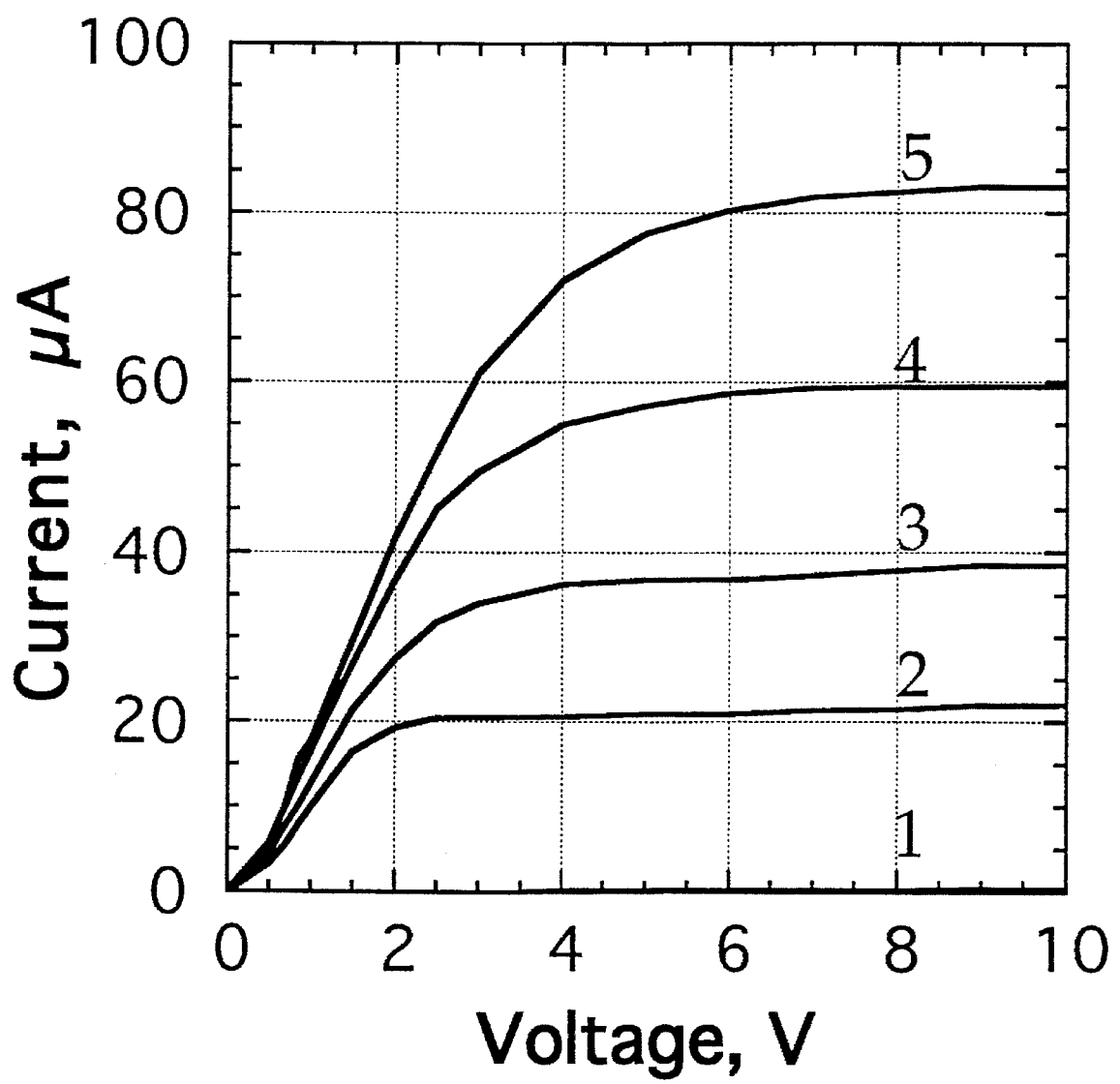
FIG. 12 illustrates the "photo" transistor action of the structure created in the Si:Li sample.

FIG. 12 illustrates a "photo" transistor action of structure shown in FIG. 11B, using the electron beam instead of a photon beam. In curves 1 to 5: 1: $I_B$=0 nA (dark current); 2: $I_B$=2 nA; 3: $I_B$=3.1 nA; 4: $I_B$=4.25 nA; 5: $I_B$=5.3 nA.

Figure 13:
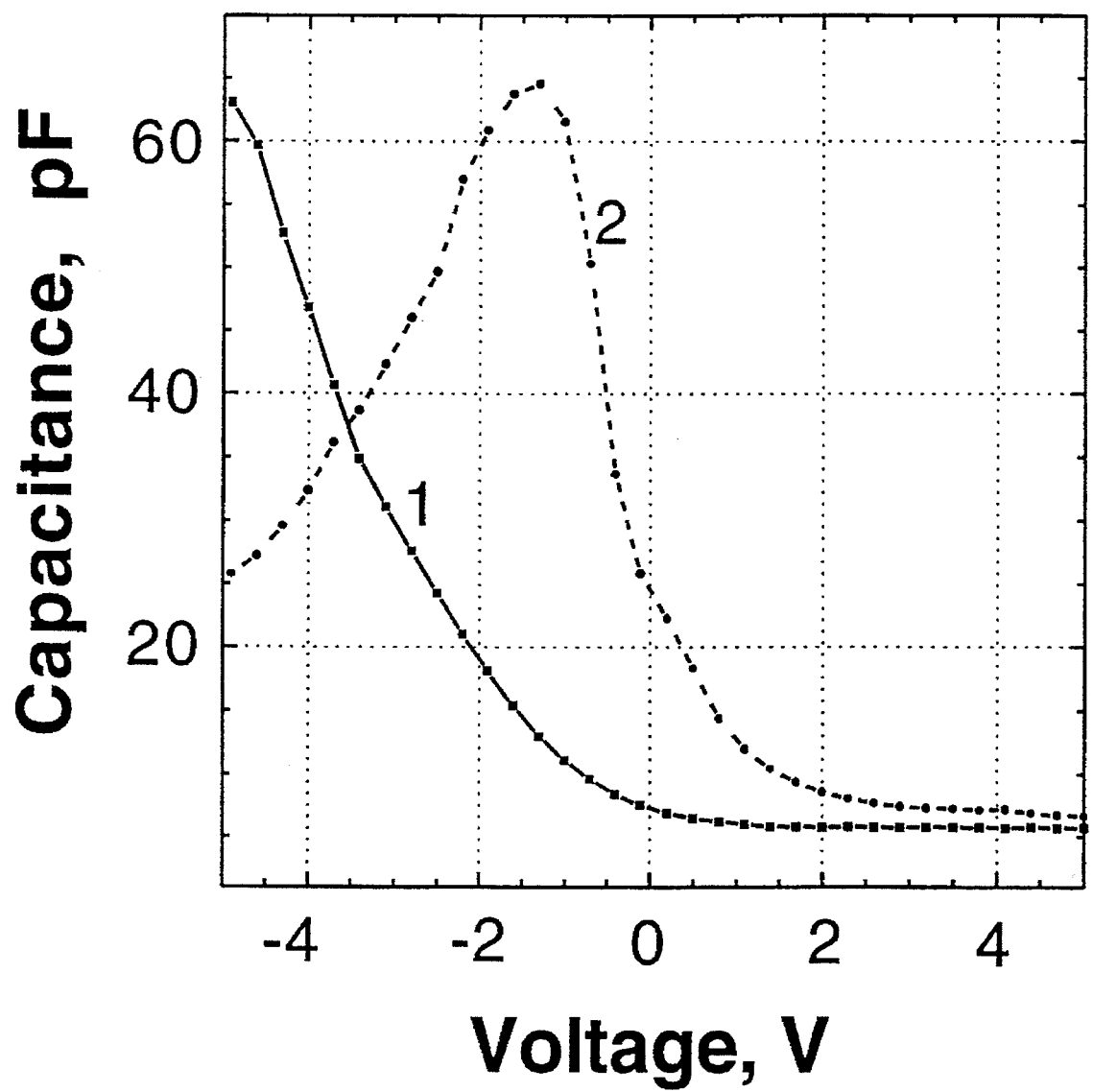
FIG. 13 illustrates the changes in the C-V characteristics before and after application of an electric field to Si:Li sample.

FIG. 13 shows the C-V characteristics of the Si:Li sample before and after structure creation. They were performed using an HP 4284A Capacitance-Conductance Meter at a frequency of $10^5$ Hz.

Curve 1 shows characteristics corresponding to a Schottky barrier (initial situation). Positive voltage on the plot corresponds to a negative voltage applied to the top contact, negative voltage corresponds to a positive voltage applied to the top contact. Curve 2 shows characteristics for structure obtained after E-field application. Polarity is as for curve 1.

Figure 14:
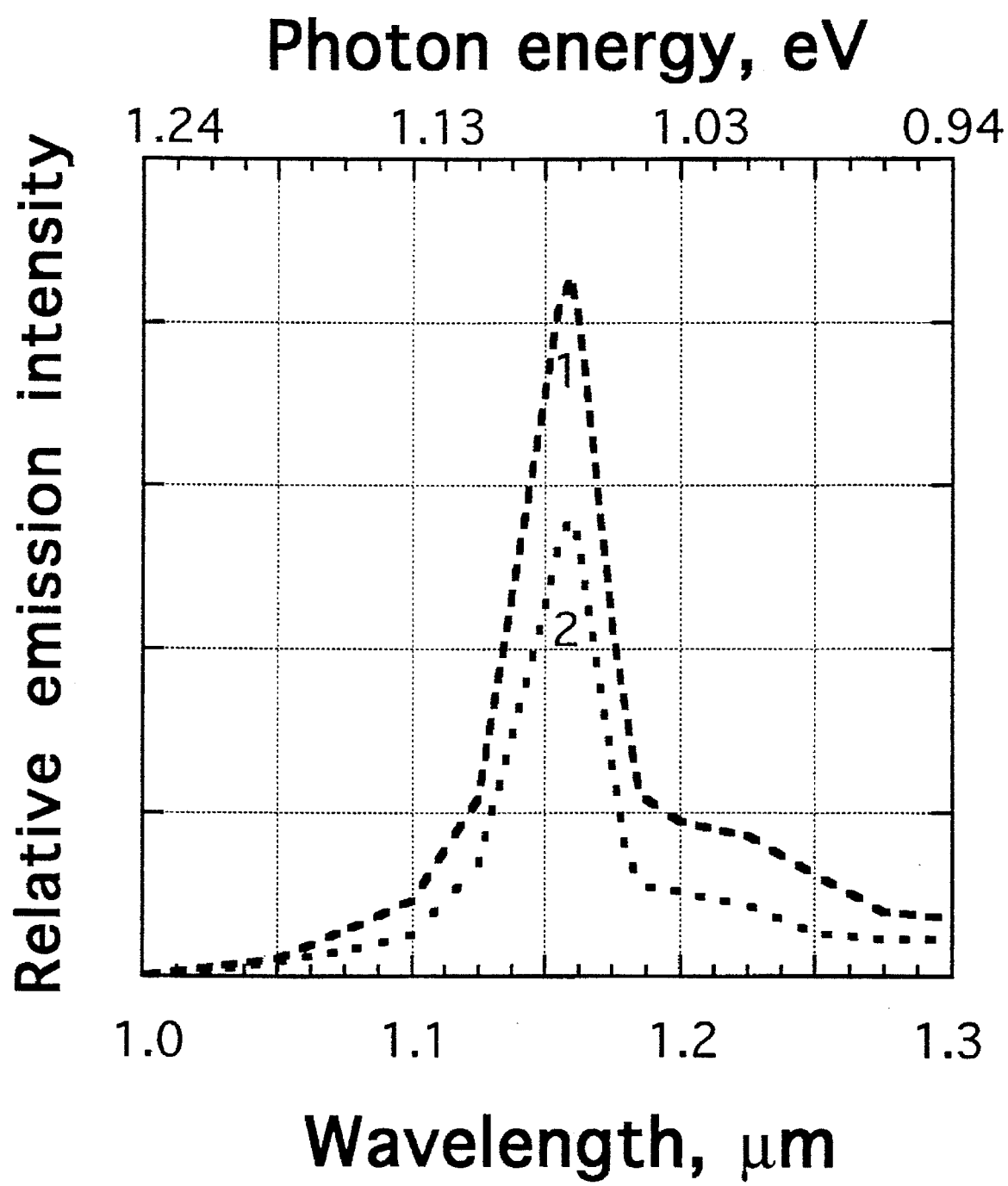
FIG. 14 shows the electroluminescence spectra from the device structure created in the Si:Li sample.

FIG. 14 shows the electroluminescence spectra from an electric field-induced structure in Si:Li at 81K. The sample was placed on a Joule-Thomson cooler inside a controlled atmosphere chamber (MMR, Mountain View, Calif.), equipped with micromanipulators. The chamber is evacuated to about 10 mTorr. An external electric field is applied to the sample in this configuration. The electroluminescence signal passed through the optical window (sapphire) of the micromanipulator and a monochromator with near-infrared (0.7–1.6 µm) grating. The bandpass is ~20 nm. The signal impinged on a North Coast E0-817 near-infrared range (0.8–1.8 µm) Ge Detector. The 45 Hz signal was amplified by a lock-in amplifier. In the curves 1 and 2; 1: current through the structure=11 mA; 2: current through the structure=9.5 mA. Approximate area of the junction $6 \cdot 10^{-5}$ cm$^2$.

Figure 15:
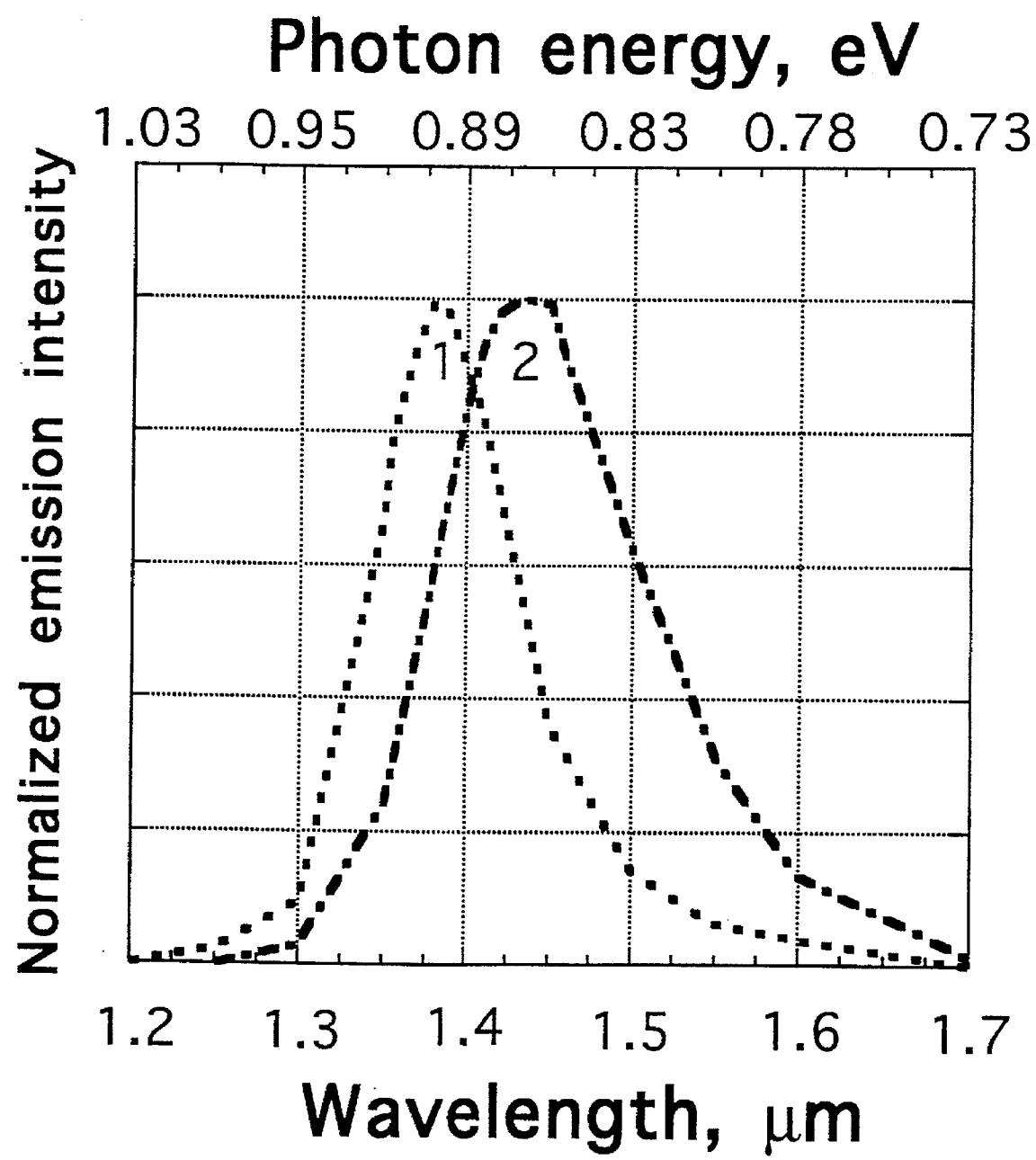
FIG. 15 shows the electroluminescence spectra from the device structure created in the $CuInSe_2$ sample.

FIG. 15 shows the electroluminescence spectra from forward biased CuInSe$_2$—based junctions. Signals are normalized with respect to their maximal values. Experimental set-up is as for FIG. 14.

Curve 1: Electroluminescence at 80K from Au/CuInSe$_2$ contact, before applying an electric field to create a structure; the current through the Schottky barrier is equal to 4 mA; geometric junction area ~$2 \cdot 10^{-5}$ cm$^2$.

Curve 2: Electroluminescence at 80K from the n/p junction resulting from applying an Electric Field to CuInSe$_2$. Electroluminescence results when a current of 4 mA is passed through the n/p junction, created around the 50 µm diameter gold contact. Approximate area of the n/p junction is $3.8 \cdot 10^{-4}$ cm$^2$.

Figure 16:
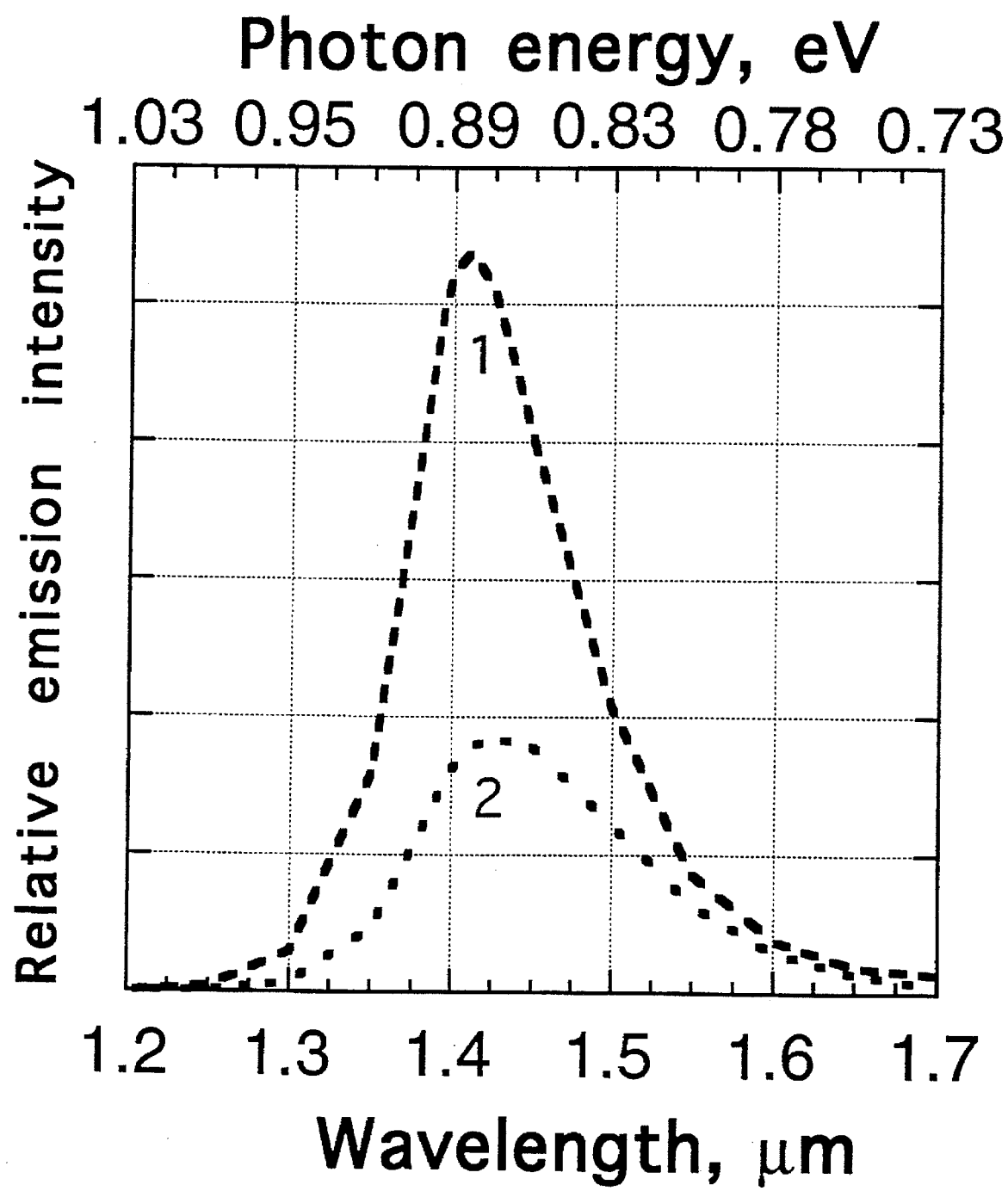
FIG. 16 shows the electroluminescence spectra from the device structure created in the $Cu(Ag)InSe_2$ sample.

FIG. 16 presents in curves 1 and 2:

1: Electroluminescence spectrum at 80K obtained from a p/n junction of p/n/p structure created in originally p-type Cu(Ag)InSe$_2$ semiconductor. The current through the junction is 0.45 mA; top contact of the sample (cf. FIG. 6) is positively biased.

2: Electroluminescence spectrum at 80K obtained from an n/p (bulk of semiconductor) junction of the same structure. The current through the junction is 0.45 mA; top contact of the sample is negatively biased.

Approximate area of the junctions is ~4·10$^{-4}$ cm$^2$.

Figure 17A:
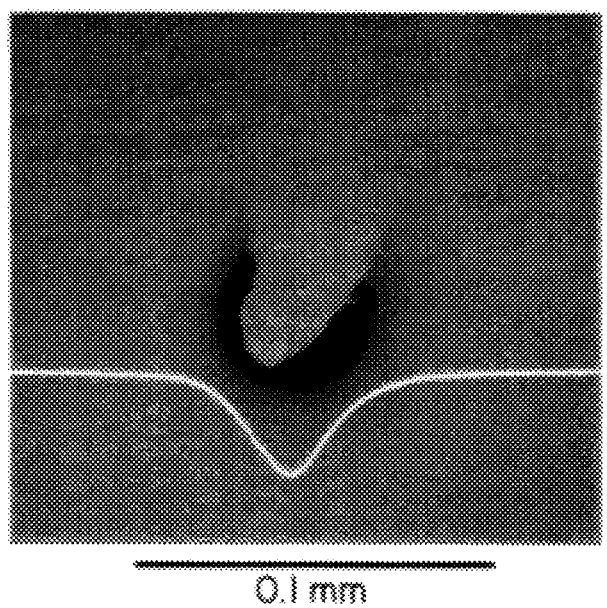
FIG. 17 illustrates the changes in the EBIC contrast before and after electric field application to the Si doped by Cu(Si:Cu).

FIG. 17 presents the EBIC contrasts before and after electric field application to Si doped by Cu, in which:

FIG. 17A. Initial EBIC contrast and superimposed EBIC line-scan corresponding to a W(tip)/Si:Cu barrier.

Figure 17B:
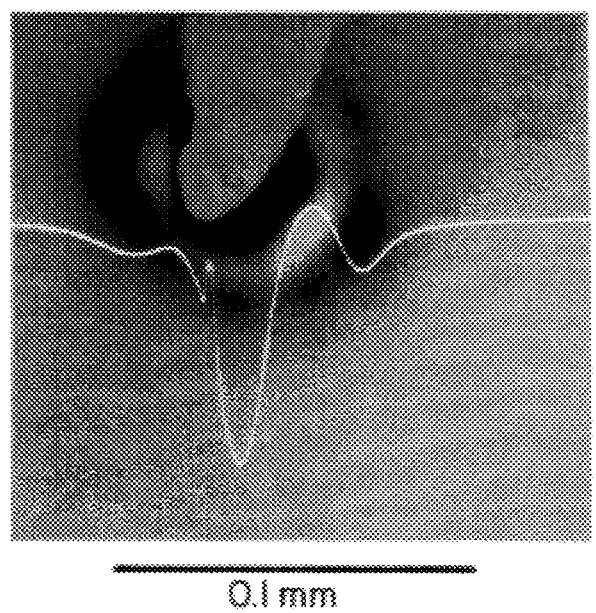

FIG. 17B. EBIC contrast and line-scan of the E-field-induced structure. White EBIC contrast (positive EBI current on the line-scan) corresponds to p$^+$/p$^-$ junction; black EBIC contrast (negative EBIC on the line-scan) corresponds to p$^-$/p$^+$ (bulk of semiconductor) junction.

Figure 18:
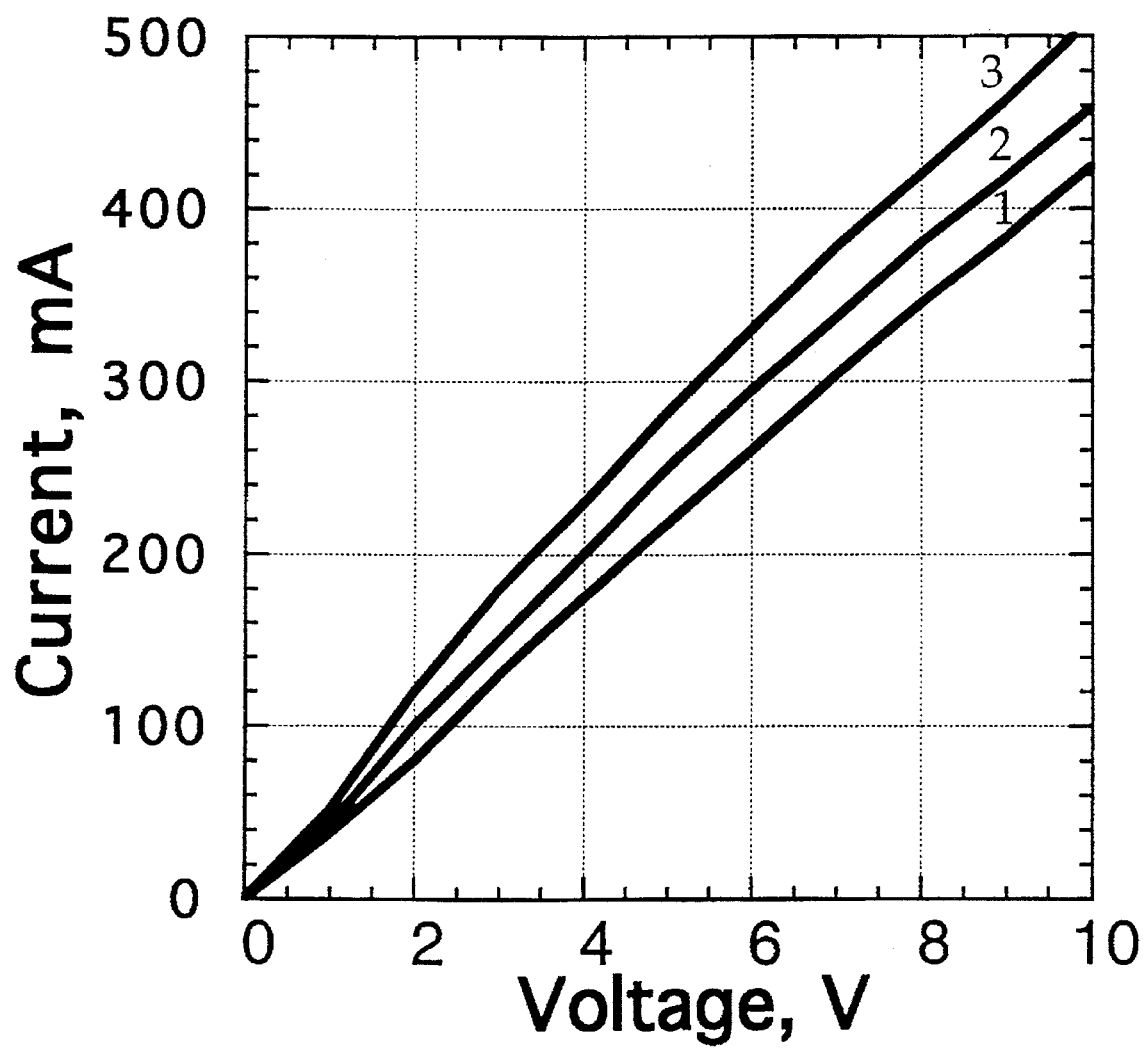
FIG. 18 illustrates the "photo" transistor action of the structure created in the Si:Cu sample.

FIG. 18 shows "photo" transistor action of the structure shown in FIG. 16b, using the electron beam instead of a photon beam. In curves 1 to 3: 1: I$_B$–0 nA (dark current); 2: I$_B$=2.5 nA; 3: I$_B$=5.3 nA.

EXAMPLE I (FIG. 2)

A p-type crystal of CuInSe$_2$, (21) with area of 5 mm$^2$ and about 1 mm thick, was used as sample. It had a net hole concentration of 6*10$^{17}$ cm$^{-3}$, a hole mobility of 5 cm$^2$/V.sec and a room temperature resistivity of 2.1Ω.cm. A 6 μm diameter Au point electrode (23) was used as pressure contact on top of the sample. A large Au contact (22) was sputtered onto the back of the crystal. The sample was mounted on a metal stage (24), serving as a heat sink, in a SEM. A DC electric field (25) was applied as is shown in FIG. 2, yielding 6 V between the Au point and back electrodes. Joule heating provided a thermal gradient (hot point electrode and cold back contact). After this treatment EBIC scans showed the formation of a circular junction (26) at about 200 μm from the point electrode with a collection efficiency between 10$^3$ and 10$^4$. The I-V characteristic proved diode behavior between contacts (23) and (22). Similar results were obtained with CuInS$_2$ and Cu$_3$AsSe$_4$. Even though the surge in current through the small area top contact (cf. FIG. 2D) is short (see above), a local increase in temperature can occur in the semiconductor around this contact. To see if this can be a significant effect we measured the temperature of the area around the contact during E-field application [L. Chernyak, et al., 1994, Appl. Phy. Lett., 65, 427.] The peak power dissipated during the creation of a transistor structure (using a periodic applied voltage as described above) varies usually from 150 to 400 mW, i.e., 10–30 times more than the power dissipated before and after the current surge (during steady state). The temperature range, which corresponds to such peak powers, varies rom 210° and 320° C. for a 2–25 μm radius Au contact.

The temperature increase can be calculated for the case of a spherical point contact. When an external periodic voltage is applied directly a spherical point contact created between a W-needle (cf. FIG. 2A) and the top surface of the semiconductor, the increase in temperature, ΔT, can be calculated as follows (H. K. Henisch, *Semiconducting Contacts: An Approach to Ideas and Models*, Clarendon, Oxford, 1984):

$$\Delta T = \frac{0.5 \cdot P}{\pi K_{th} R_0} \quad (6)$$

where P is the average power dissipated around the contact; R$_0$ is the spherical contact radius; and K$_{th}$ the thermal conductivity of the material. The average dissipated power can be obtained as (I·V)/3, where I is the amplitude of current through a contact, V is the amplitude of voltage applied to this contact. The denominator in eqn. (6) takes into account that the periodic high voltage is applied to a contact during ⅓ (8 msec) of the total period (22 msec). The semiconductor is assumed to act as an active load. If this is not so, the average dissipated power will be smaller than (I·V)/3. SEM investigation of a tungsten needle, used for voltage application shows R$_0$≈5 μm. Using K$_{th}$=100·10$^{-2}$ W/cm·°C., V=25 Volt and I=12 mA, we obtain ΔT=319° C. This temperature is 670° C. lower than the reported melting temperature of CuInSe$_2$. Indeed, careful SEM investigation of the place of an external voltage application found no evidence for decomposition or melting.

Up to 5 Volt reverse bias was applied to an evaporated Au spot on p-Cu$_{0.95}$Ag$_{0.05}$InSe$_2$, kept at 300° C., inside the SEM. Under these conditions graded and relatively weak junctions form during a few seconds, times that are two orders of magnitude longer than when the sample is kept at room temperature. Contrary to what is observed at room temperature no current spike is seen when the sample is kept at 300° C.

EXAMPLE II (FIG. 6)

An n-type crystal of CuInSe$_2$(61) (1.1 mm thick) was prepared as in Example I, and a Pt point electrode (65) was used. It had a net donor density of 3*10$^{17}$ cm$^{-3}$, a mobility of 70 cm$^2$/V.sec and a resistivity of 0.3Ω.cm. The Pt/CuInSe$_2$ contact had rectifying properties. Square electric voltage pulses of 6 V at 2.5 Hz and 0.2 duty factor (an AC field) (66) were applied during about 5 min. in reverse direction of this contact (point electrode negative and the back electrode positive). The back side of the sample was kept at 150° K. Joule heating provided a thermal gradient. After this treatment, EBIC scans showed the formation of a n-p-n transistor-like structure in the crystal. Thus emitter/base (64/63) and base/collector (63/61) junctions appeared at 15 and 18 μm from the point electrode. Similar results were obtained with Cu$_3$SbS$_3$ and CuInS$_2$.

EXAMPLE III (FIG. 5)

A sample, as in Example II was provided with two gold ohmic contacts (54) of 100 μm×100 μm on the top surface. Current pulses (2 Hz, 20% filling factor, power per pulse: less than 20 mW) were applied by a source (56) for 24 hours to the back contact (57) and the two top contacts (54), which were kept shorted. After this treatment diode behavior was obtained between each of the top contacts and the back electrode. After this process electric voltage pulses (2 Hz, 20% filling factor or duty cycle, power per pulse: less than 20 mW) were applied for 10 hours using a voltage divider (50) (FIG. 5B). As a result a transistor structure (51/52/53) was obtained, as examined by EBIC. FIG. 10 shows the static I-V curves of this transistor. Similar results were obtained with Cu$_2$GeSe$_3$ and CuInS$_2$.

EXAMPLE IV

An n-type crystal of CuInSe$_2$ was prepared and treated as in Example III. The treatment was continued for about 10 minutes. EBIC scans after the treatment show the formation of an n-p-n-p structure with junctions at 8, 15 and 18 μm in the crystal, around the point electrode. Similar results were obtained with $Cu_3AsS_4$ and $CuInS_2$.

EXAMPLE V

An n-type $AgInSe_2$ crystal was prepared as in Example I using Pt contacts at $\leq 6$ μm diameter. The sample had a net donor concentration of $4*10^{13}$ $cm^{-3}$, a mobility of about 200 $cm^2/V.sec$ and a resistivity of about 700Ω.cm. An AC electric field was applied (2 Hz, 0.2 duty cycle) for 10 hours with the point electrode 6 V positive with respect to the back electrode (forward direction of the $Pt/AgInSe_2$ rectifying contact). After this treatment EBIC scans show the formation of a collection region around the point electrode, allowing collection from a hemisphere, with the collection efficiency decreasing to ⅓ of its peak (center) value at 60 μm from the center. Similar results were obtained with $CuIn_5S_8$ and $AgIn_5Se_8$.

EXAMPLE VI

An n-type $CuInSe_2$ crystal with net donor density of $3*10^{17}$ $cm^{-3}$, mobility of 20 $cm^2/V.sec$ and resistivity of 1Ω.cm, 1.0 mm thick, was prepared as in Example I. After a treatment identical to that described in Example V, a collection region was created as observed in Example V for $AgInSe_2$. This region extends to 85 μm from the point electrode. Similar results were obtained with $AgInS_2$ and $AgIn_5S_8$.

EXAMPLE VII (FIG. 3)

A $CuInSe_2$ p-type crystal (31) (the same properties as the sample in Example I) provided with two large area Au ohmic contacts (32 & 33) on the top surface (distance between contacts about 1 mm) was mounted on a thermoelectric cooler (38). A thermocouple was attached to the crystal. The crystal was illuminated with white light (37) through a grid (371) positioned between the contacts. Stabilized current pulses (35) of one sign (100 mA, 20% filling factor, frequency 2 Hz) were used to bias the crystal. The thermoelectric cooler (38) prevented temperature rise of the crystal due to both light illumination and Joule heating. The temperature of the crystal was less than 305° K (33,39) during the whole experiment. After 48 hours, permanent changes in local resistivity in the near top surface region of the crystal were revealed by EBIC. The changes reflected in their geometrical form the shape of the grid. Similar results were obtained in $CuGaSe_2$ and $CuGe_2P_3$.

EXAMPLE VIII (FIG. 4)

Figure 4B:
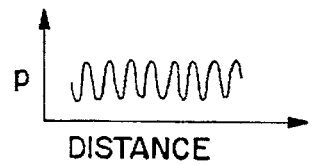

A p-type $CuInSe_2$ crystal (41) with the same properties as in Example I was prepared as in Example VI. This time however, instead of illumination through a grid, two laser beams (49) were used to produce an interference pattern on the top surface of the sample (47). After biasing the sample under the same conditions as in Example VI a stable resistivity pattern in the sample was revealed by EBIC, reflecting in its geometrical form the light interference pattern (FIG. 4B). Similar results were obtained with $CuInTe_2$, $AgSbSe_2$ and $CuSn_2Se_3$.

EXAMPLE IX (FIG. 9)

A sample (91), as in Example II, was provided with seven gold ohmic contacts (100 μm×100 μm.) (941–947) as shown in FIG. 9. Current pulses as in Example III were applied for 24 hours to the back contact (96) and the seven top contacts which were kept shorted. After this treatment diode behavior was obtained between each of the top contacts and the back electrode (regions 91 and 92). After this process electric voltage pulses, as in Example III were applied for 10 hours using a voltage divider (99). As a result a structure was obtained (regions 91,92,93) that corresponds to the schematic electronic circuit shown in FIG. 9B. 97 represents an added resistor. Similar results were obtained with $CuInS_2$.

EXAMPLE X (FIG. 20)

An n-type crystal of $Hg_{0.3}Cd_{0.7}Te$, with an area of 5 $mm^2$ and 1 mm thick, was used as a sample. It had a net electron concentration $n=1.77\times10^{16}$ $cm^{-3}$, mobility $\mu=730$ $cm^2/V.sec$ and resistivity of $\rho=0.48Ω.cm$ at room temperature. The sample was mechanically polished and 50 μm diameter gold spots, 20 nm thick were evaporated on its surface. Preliminary I-V measurements showed these gold spots to be rectifying Schottky contacts. Reverse bias, with respect to the Schottky contact, was applied in the form of periodical pulses, as in Example VII. The voltage was supplied between the gold spots and the back contact. When the applied voltage increased slowly (from 5 to 20 V during 12 hours) smooth changes are observed in the shape of the I-V curves, indicating improvement of their rectifying properties. EBIC scans taken after this treatment showed that a p-n junction had been created around the gold spot, at about 200 μm from the center of it. Similar results were obtained with samples of $(Cd,Zn,Hg)Te$ and $(Hg,Zn)Te$.

EXAMPLE XI

A sample of Si with typical size 1×1×0.1 cm was cut from a p-type, (111) oriented, floating zone wafer ($\rho=10Ω.cm$). Floating zone Si crystals have significantly higher Li ion mobility than Czochralski grown ones due to their lower oxygen content. The sample was covered by 30% Li dispersion in mineral oil, dried and annealed at 600° C. for 4 hours, all in Ar atmosphere, and afterwards in vacuum at 250° C. for 16 hours. This leads to type-conversion from p to n. The sample was mechanically polished after annealing. Type-conversion was checked by Hall measurements ($n=5\cdot10^{14}$ $cm^{-3}$; $\mu=1650$ $cm^2/V.sec$; $\rho=10Ω.cm$) and by the Electron Beam Induced Current (EBIC) technique in the Scanning Electron Microscope (SEM). The EBIC contrast from a barrier created by a tungsten needle (adjusted inside the SEM) on the surface of Li-doped Si is seen as a white spot in FIG. 11a. This corresponds to a metal/n-type barrier (electrons flow away from the needle into the sample). Standard working conditions for the SEM were: 30 kV accelerating voltage; 100–500 nm electron beam spot size; ~1–6 nA electron beam current. With these conditions, the induced current, $I_{EBIC}$, is ~0.3 μA. This current results from electron-hole pairs, created in the semiconductor by the high energy electrons. Trapezoidal voltage pulses of ~120–150 Volt with a duty cycle of ~33% and 45 Hz frequency were used to apply reverse bias to the W needle/Si (metal/semiconductor) barrier, with the W needle negative with respect to the back contact (cf. FIG. 11c). This needle is fixed in the SEM vacuum chamber; the XYZ sample stage is used as manipulator to make the contact. The second contact, needed for EBIC, was made at the back surface of the sample.

E-field application to the sample leads to evolution of the initial, single contrast EBIC image (FIG. 11a) to a double contrast one (FIG. 11b). The structure shown in FIG. 11b corresponds to what is expected for an n/p/n transistor. The black (internal) and white (external) EBIC contrasts correspond to two junctions, electrically connected back-to-back, as shown schematically in FIG. 11c. No changes from the initial EBIC contrast were seen after reverse voltage application (up to 500 V) to the original p-Si (before doping with Li).

Transistor action, including amplification was obtained from the created n/p/n structure. It was checked by way of two-terminal phototransistor behavior, using the same top and bottom contacts, that served to create the device, as emitter and collector. Current between emitter and collector, $I_c$, was controlled by the SEM electron beam, rather than by a photon beam. The dependence of $I_c$ on the voltage between the top and bottom contacts, $V_{CE}$, was measured for different values of electron beam current, $I_B$, as shown in FIG. 12. The amplification coefficient $\beta$ of this "photo" transistor can be calculated according to the equation:

$$\beta = \frac{\Delta I_c}{\Delta I_B \times G} \quad (1)$$

where $\Delta I_c$ is the difference between currents through the structure at different values of $I_B$, $\Delta I_B$ is the difference between beam currents and G is the generation factor. The theoretical maximum of G (for 30 keV electrons) is 7,500 for Si. The real generation factor can be less. Using equation (1) we obtain, from the data shown in FIG. 12, $\beta=2.4$.

The voltage dependencies of the capacitance (C-V) between the two contacts, used for the EBIC and transistor measurements (FIG. 13), support the conclusion that a double diode structure formed after E-field application. Positive voltage corresponds to reverse bias across this barrier, negative voltage to forward bias. Before E-field application, the capacitance decreases in the direction of reverse bias, what is typical for a single junction. The decrease in capacitance in both directions of applied voltages, observed after E-field application, is typical for two junctions that are back-to-back connected is electrically.

The total electric power dissipated on and around the contact can be up to ~2.25 Watt (15 mA current at 150 V applied voltage). This can lead to local temperature increases which will facilitate electromigration. Metals with different melting points were used as contacts (In, Sn, Pb and Zn) for the calibration of temperature. In this way we estimate the temperature during transistor structure creation in Si to be ~350°–400° C. To investigate the role of "pure" thermal diffusion in the process, a W contact on Si was biased in forward direction. In this case the strength of the external electric field is much lower than for a reverse-biased contact. Therefore, changes in the local electrical properties that result can be ascribed to thermal effects. A total electric power of ~1.5 Watt (T~350° C.) was dissipated on and around the contact for ~3–5 minutes. No changes in EBIC contrast (see FIG. 11a) or in electrical properties were observed.

The Si:Li transistors that are created in this way and, therefore, the non-equilibrium doping profiles, are stable at room temperature. In principle, one can expect relaxation of the non-equilibrium profile as a result of diffusion in the chemical potential gradient. In practice this process is very slow due to low Li diffusivity at room temperature (D~$10^{-16}$ cm$^2$/sec). The structure is stable on a scale of 10 µm for ~300 years (!) at the above mentioned value of diffusivity.

EXAMPLE XII

Electroluminescence spectra from a structure, formed after E-field application, as in Example XI, are shown in FIG. 14. These spectra are taken while forward biasing the internal n/p junction (cf. FIG. 11c). They show a maximum at 1157 nm (1.07 eV), i.e., some 0.08 eV below the 80K bandgap of Si. This energy can correspond to that of the Li$_i$-VB transition, if Li$_i$ creates a level of 80 meV below the bottom of the conduction band. No EL could be obtained when the external p/n junction (cf. FIG. 11c) or the original W/Si:Li barrier were forward biased. The internal quantum efficiency for EL was estimated to be 1% at 81K, by considering the small escape cone (calculated for a refractive index of 3.5 at $\lambda=1.2$ µm at the Si-air interface).

EXAMPLE XIII

A diode-like structure was created by application of an electric field to a 50 µm diameter Au contact evaporated on the top surface of p-CuInSe$_2$ (p=2.10$^{17}$ cm$^{-3}$; µ=10 cm$^2$/V.sec; $\rho$=1.5$\Omega$.cm), as described in Example I. FIG. 15 shows the electroluminescence spectrum from a Au/p-CuInSe$_2$ barrier, before electric field application to it, and from the n/p diode structure created in the sample by electric field application to the Au/CuInSe$_2$ barrier (Schottky barrier). The spectrum of the Schottky barrier 1 is relatively narrow. It has a maximum at 1.38 µm (0.90 eV). The spectrum from the electric field-induced n/p structure 2 is much broader and shifted towards higher wavelengths (maximum at 1.435 µm; 0.864 eV). Such a relative broadening can be explained by the accumulation and/or creation of additional point defects (Cu$_i$ and/or V$_{Cu}$) as a result of electric field application. The internal quantum efficiencies, η, for the electroluminescence from the Schottky barrier and the E-field induced structure are 0.5 and 8%, respectively. This can be compared with an internal electroluminescence quantum efficiency of ~10% (at 77K) that was reported for a thermally created diode by P. Migliorato, J. L. Shay, H. M. Kaper, S. Wagner, J. Appl. Phys., 1975, 46, 1777. Results, similar to those presented in FIG. 15 for CuInSe$_2$ were obtained for Cu$_{0.95}$Ag$_{0.05}$InSe$_2$.

EXAMPLE XIV

A transistor p/n/p vertical structure was created in p-type Cu$_{0.95}$Ag$_{0.05}$InSe$_2$ (p=5·10$^{17}$ cm$^{-3}$; µ=14.5 cm$^2$/V.sec; $\rho$=1.1$\Omega$.cm), as was described in Example I. We can obtain electroluminescence either from the p/n (internal) junction or from the n/p (external) junction depending on which one is biased in the forward direction in this structure.

Electroluminescence from the internal p/n junction 1 (cf. FIG. 16) corresponds to stronger electroluminescence than that from the outer n/p (bulk semiconductor) junction 2 (top contact negatively biased). The estimated internal quantum efficiency µ is 3.5% for 1 and 1.2% for 2. The maxima of spectra 1 and 2 are ~10 meV shifted with respect to each other (0.88 eV—spectrum 1; 0.87 eV—spectrum 2). These differences in the spectra are due to the asymmetry of the electric field-induced p/n and n/p junctions. Because of the low Ag content in the sample (1.6 at. %) the band gap for this quaternary material practically coincides with that for CuInSe$_2$ (1.010 eV and 1.012 eV, respectively for Cu(Ag)InSe$_2$ and CuInSe$_2$ at 300K, from interpolation between the data given by R. Bacewicz, J. R. Durrant, T. F. Ciszek, and S. K. Deb, in *Ternary and Multinary Compounds*, S. K. Deb and A. Zunger, eds. (MRS, Pittsburgh, 1987), Vol. TMS, pp. 155–160.

EXAMPLE XV

Floating zone, (111) oriented p-type Si crystal ($\rho$=10$\Omega$.cm) was doped by Cu during 2 hrs at 560° C. Interstitial Cu is known to act as a single donor in p-type Si.

It was found that the conductivity type did not change during the doping, but the specific resistivity of the sample increased, as was seen from the I-V curve.

Similar to the experiment described in the Example XI, the present experiment was performed in situ in the SEM. The standard working conditions for the SEM are the same as in Example XI. Trapezoidal voltage pulses of ~300 Volt with a duty cycle of ~33% and 45 Hz were applied in reverse direction to the point contact W needle/Si, with the W needle positive with respect to the back contact (configuration is similar to the one presented in FIG. 11c). FIG. 17a presents the EBIC-contrast and the line-scan from the point contact before electric field application. FIG. 17b corresponds to the situation after electric field application: white (internal) and black (external) EBIC contrasts correspond to the created transistor-like structure (p+/p–/p). The direction of ion migration in the considered case is opposite to the one for n-type Si doped by Li. FIG. 18 presents the I-V curves corresponding to the created structure when the internal junction works as the emitter one and the external junction as the collector one. The amplification behavior of this structure (β=2.0) and the transistor performance itself are less pronounced than in the case of the I-V curves shown in FIG. 12, because the conversion of the type of conductivity from p to n does not occur during the electromigration of Cu (case of relatively low initial Cu concentration ($<10^{17}$ cm$^{-3}$) is meant here). Type-conversion can be achieved if the initial Cu concentration is $~10^{17}$ cm$^{-3}$.

Although the invention has been described in detail, changes may be made which do not depart from the inventive teachings; such are deemed to fall within the purview of the claimed invention.

We claim:

1. A process for the production of a monolithic electronic and/or optoelectronic single-element or multi-element structure from a semionic material selected from the group of semionic materials comprising doped elemental semiconductors and doped binary, ternary or multinary chalcogenide or pnictide semiconductors, said process comprising:

(a) establishing a location in a semionic body;

(b) applying an electric field to said location in said semionic body;

(c) maintaining said semionic body including said location at a temperature sufficiently low to preclude melting or decomposition of the semionic body while said electric field is being applied; and (d) controlling the electric field as to magnitude and time so that no decomposition and macroscopic melting of the material occurs while creating doping profiles sufficiently sharp to define at least one homojunction and thus create an electronic or optoelectronic device element in the semionic material in said location thereof.

2. A process according to claim 1, wherein the semionic material is a doped elemental semiconductor.

3. A process according to claim 2, wherein said doped elemental semiconductor has the formula IV:I, in which the group IV element is Si or Ge, and the group I dopant element is selected from Li, Na, Cu and Ag.

4. A process according to claim 3, wherein said semionic doped elemental semiconductor is Si:Li.

5. A process according to claim 1, wherein the semionic material is selected from the group comprising semionic doped binary chalcogenide and pnictide semiconductors.

6. A process according to claim 5, wherein said doped binary chalcogenide comprises one or more foreign dopants and is selected from the group of materials of the formula II-VI:I, wherein the group II elements are Cd or Zn, the group VI elements are S, Se or Te, and the group I dopant elements are Li, Na, Cu or Ag.

7. A process according to claim 5, wherein said doped binary chalcogenide is a semionic binary alloy chalcogenide semiconductor including native dopant of formula (IIa,IIb)-VI, wherein IIa and IIb are two elements selected from the group comprising the elements Cd, Zn and Hg, and the group VI element is S, Se or Te.

8. A process according to claim 1, wherein the created electronic device in step (d) is a transistor.

9. A process according to claim 1, wherein the created optoelectronic device in step (d) is a light-emitting diode, a phototransistor or a radiation detector.

* * * * *